United States Patent
Kim et al.

(10) Patent No.: US 11,631,711 B2
(45) Date of Patent: Apr. 18, 2023

(54) IMAGE SENSOR AND IMAGE SENSING DEVICE

(71) Applicant: Samsung Electronics Co., Ltd., Suwon-si (KR)

(72) Inventors: Dae Shik Kim, Hwaseong-si (KR); Young Gu Jin, Osan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 34 days.

(21) Appl. No.: 17/366,868

(22) Filed: Jul. 2, 2021

(65) Prior Publication Data

US 2022/0150430 A1   May 12, 2022

(30) Foreign Application Priority Data

Nov. 6, 2020   (KR) .................. 10-2020-0147218

(51) Int. Cl.
*H01L 27/146*   (2006.01)
*H04N 25/771*   (2023.01)
(Continued)

(52) U.S. Cl.
CPC .. *H01L 27/14634* (2013.01); *H01L 27/14609* (2013.01); *H01L 27/14643* (2013.01); *H04N 25/40* (2023.01); *H04N 25/75* (2023.01); *H04N 25/76* (2023.01); *H04N 25/77* (2023.01); *H04N 25/771* (2023.01)

(58) Field of Classification Search
CPC ........ H04N 5/341; H04N 5/353; H04N 5/374; H04N 5/3745; H04N 5/37452; H04N 5/378; H04N 5/379; H04N 25/40; H04N 25/53; H04N 25/75; H04N 25/76; H04N 25/77; H04N 25/771; H04N 25/79; H01L 25/0657; H01L 27/14609; H01L 27/14634; H01L 27/14636; H01L 27/14643; H01L 27/226
See application file for complete search history.

(56) References Cited

U.S. PATENT DOCUMENTS

| | | | |
|---|---|---|---|
| 6,995,346 | B2 | 2/2006 | Johanneson et al. |
| 7,692,700 | B2 | 4/2010 | Johannesson et al. |
| (Continued) | | | |

FOREIGN PATENT DOCUMENTS

KR   10-2018-0083691 A   7/2018

*Primary Examiner* — Lin Ye
*Assistant Examiner* — Chriss S Yoder, III
(74) *Attorney, Agent, or Firm* — Muir Patent Law, PLLC

(57) ABSTRACT

An image sensor comprises an upper chip including pixels; and a lower chip placed below the upper chip, wherein a pixel of the pixels includes an optical conversion element configured that light is incident on the optical conversion element, a first storage gate or a first storage node which is electrically connected to the optical conversion element and configured to store electric charge transferred from the optical conversion element during a first time interval, and a second storage gate or a second storage node which is electrically connected to the optical conversion element and configured to store the electric charge transferred from the optical conversion element during a second time interval different from the first time interval, the pixel is configured to generate a first pixel signal on the basis of the electric charge stored in the first storage gate, the lower chip includes a frame buffer.

15 Claims, 26 Drawing Sheets

(51) Int. Cl.
*H04N 25/75* (2023.01)
*H04N 25/40* (2023.01)
*H04N 25/76* (2023.01)
*H04N 25/77* (2023.01)

(56) References Cited

U.S. PATENT DOCUMENTS

| | | |
|---|---|---|
| 9,392,204 B2 | 7/2016 | Saito |
| 9,749,569 B2 | 8/2017 | Mabuchi et al. |
| 10,157,951 B2* | 12/2018 | Kim .................. H04N 5/37457 |
| 10,397,506 B2 | 8/2019 | Mabuchi |
| 2019/0104272 A1 | 4/2019 | Izuhara et al. |
| 2019/0281241 A1 | 9/2019 | Jin et al. |
| 2020/0111823 A1 | 4/2020 | Jin et al. |
| 2020/0185439 A1* | 6/2020 | Jin ....................... G11C 11/5607 |
| 2020/0351440 A1* | 11/2020 | Seta .................. H04N 5/23225 |

* cited by examiner

IMS4

IMAGE SENSOR AND IMAGE SENSING DEVICE

This application claims priority under 35 U.S.C. § 119 to Korean Patent Application No. 10-2020-0147218 filed on Nov. 6, 2020 in the Korean Intellectual Property Office, the disclosure of which is incorporated herein by reference in its entirety.

BACKGROUND

1. Field of the Invention

The present invention relates to an image sensor and an image sensing device.

2. Description of the Related Art

An image sensing device is one of semiconductor devices that convert optical information into an electric signal. Such an image sensing device may include a charge coupled device (CCD) image sensing device and a complementary metal-oxide semiconductor (CMOS) image sensing device.

The CMOS image sensor may be abbreviated as a CIS (CMOS image sensor). The CIS may have a plurality of pixels placed two-dimensionally. Each of the pixels may include, for example, a photodiode (PD). The photodiode may serve to convert incident light into electrical signal.

Recently, with the development of the computer industry and the telecommunication industry, demands for image sensors with improved performance are increasing in various fields such as a digital camera, a video camera, a smartphone, a game console, a security camera, a medical micro camera, and a robot.

SUMMARY

Aspects of the present invention provide an image sensor including a frame buffer for storing a pixel signal.

Aspects of the present invention also provide an image sensing device including a frame buffer for storing a pixel signal.

However, aspects of the present invention are not restricted to the embodiments set forth herein. Aspects of the present invention will become more apparent to one of ordinary skill in the art to which the present invention pertains by referencing the detailed description of the present disclosure given below.

According to an embodiment of the present disclosure, an image sensor comprises an upper chip including pixels; and a lower chip placed below the upper chip, wherein a pixel of the pixels includes an optical conversion element configured that light is incident on the optical conversion element, a first storage gate or a first storage node which is electrically connected to the optical conversion element and configured to store electric charge transferred from the optical conversion element during a first time interval, and a second storage gate or a second storage node which is electrically connected to the optical conversion element and configured to store the electric charge transferred from the optical conversion element during a second time interval different from the first time interval, the pixel configured to generate a first pixel signal on the basis of the electric charge stored in the first storage gate, and configured to generate a second pixel signal on the basis of the electric charge stored in the second storage gate, the lower chip includes a frame buffer configured to store the generated first and second pixel signals; and an image signal processor configured to receive the stored first and second pixel signals from the frame buffer and perform image processing on the first and second pixel signals, and the frame buffer includes an MRAM.

According to the aforementioned and other embodiments of the present disclosure, an image sensor comprises an upper chip including pixels; an intermediate chip located below the upper chip; and a lower chip placed below the intermediate chip, wherein a pixel of the pixels includes an optical conversion element configured that light is incident on the optical conversion element, a first storage gate or a first storage node which is electrically connected to the optical conversion element and configured to store electric charge transferred from the optical conversion element during a first time interval, and a second storage gate or a second storage node which is electrically connected to the optical conversion element and configured to store the electric charge transferred from the optical conversion element during a second time interval different from the first time interval, the pixel configured to generate a first pixel signal on the basis of the electric charge stored in the first storage gate, and to generate a second pixel signal on the basis of the electric charge stored in the second storage gate, the intermediate chip includes a first image signal processor configured to receive the first and second pixel signals from the pixel, and to perform image processing on the first and second pixel signals to generate a first image signal, the lower chip includes a first frame buffer configured to receive and stores the first image signal from the first image signal processor, and a second image signal processor configured to receive the stored first image signal from the first frame buffer and to perform image processing on the first image signal to generate a second image signal, and the first frame buffer includes an MRAM.

According to the aforementioned and other embodiments of the present disclosure, an image sensing device comprises an image sensor which includes pixels, a frame buffer, and an image signal processor; and an application processor electrically connected to the image sensor; wherein a pixel of the pixels includes an optical conversion element configured that light is incident on the optical conversion element, and first to fourth tab circuits which are commonly and electrically connected to the optical conversion element and configured to output first to fourth pixel signals different from each other, on the basis of the electric charge transferred from the optical conversion element, the frame buffer includes an MTJ element, the frame buffer configured to store the first to fourth pixel signals in the MTJ element, and the frame buffer configured to provide the stored first to fourth pixel signals to the image signal processor, and the image signal processor is configured to generate an image signal on the basis of the provided first to fourth pixel signals, and to provide the generated image signal to the application processor.

Other features and embodiments may be apparent from the following detailed description, the drawings and the claims.

BRIEF DESCRIPTION OF THE DRAWINGS

The above and other embodiments and features of the present disclosure will become more apparent by describing in detail embodiments thereof with reference to the attached drawings, in which.

DETAILED DESCRIPTION OF THE EMBODIMENTS

Embodiments according to the technical ideas of the present invention will be described below referring to the accompanying drawings.

Figure 1:
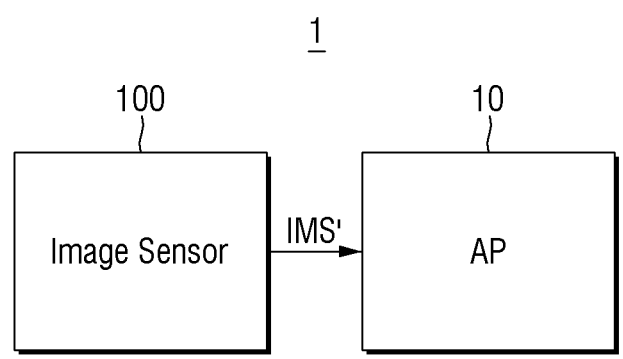
FIG. 1 is a block diagram of an image sensing device according to some embodiments.
Figure 2:
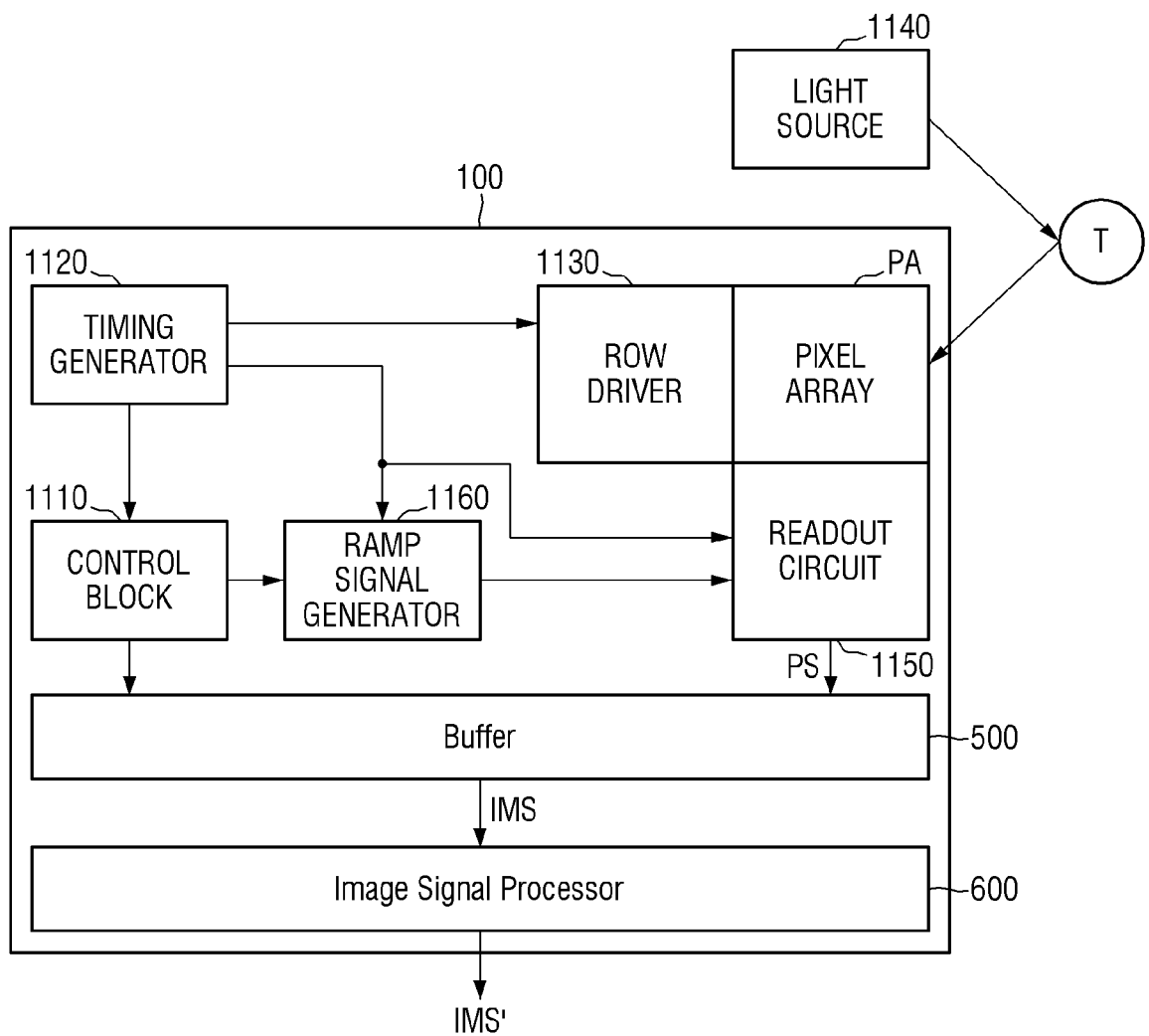
FIG. 2 is a block diagram of the image sensor of FIG. 1.
Figure 3:
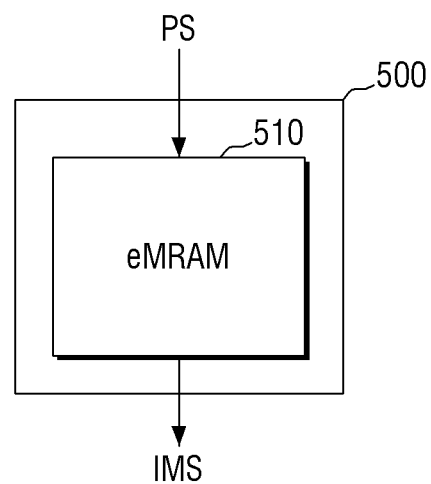
FIG. 3 is a block diagram of a buffer of FIG. 2.

FIG. 1 is a block diagram of an image sensing device according to some embodiments. FIG. 2 is a block diagram of the image sensor of FIG. 1. FIG. 3 is a block diagram of a buffer of FIG. 2.

Referring to FIGS. 1 and 2, the image sensing device 1 may include an image sensor 100 and an application processor 10. The application processor 10 may control the image sensor 100, and may receive an image signal IMS' from the image sensor 100.

The image sensor 100 may sense an image of an object by the use of light, thereby generating an image signal IMS'. In some embodiments, although the generated image signal may be, for example, a digital signal, embodiments according to the technical ideas of the present invention are not limited thereto.

The image signal IMS' may be provided to the application processor 10 for processing. The application processor 10 receives the image signal IMS' output from the image sensor 100, and may process or handle the received image signal IMS' to be easy for a display.

In some embodiments, the application processor 10 may perform digital binning on the image signal IMS' that is output from the image sensor 100. At this time, the image signal IMS' output from the image sensor 100 may be a raw image signal from the pixel array PA without analog binning, or may be an image signal in which the analog binning has already been performed. For example, binning may be a process reducing noise of images by modifying raw image signals, e.g., by using ambient information (signals) of the raw image signals.

In some embodiments, the image sensor 100 and the application processor 10 may be placed separately from each other as shown in FIG. 1. For example, the image sensor 100 may be mounted on a first chip and the application processor 10 may be mounted on a second chip, and they may electrically communicate with each other through a predetermined interface, e.g., between different packages. However, the embodiments are not limited thereto, and the image sensor 100 and the application processor 10 may be implemented as a single package, for example, an MCP (multi-chip package).

Referring to FIG. 2, the image sensor 100 may include a control register block 1110, a timing generator 1120, a row driver 1130, a pixel array PA, a readout circuit 1150, a ramp signal generator 1160, a buffer 500, and an image signal processor 600.

The optical signal repeatedly emitted from a light source 1140 as a pulse signal may be reflected from a target T. The optical signal reflected from the target T may be incident on the image sensor 100. For example, the optical signal reflected from the target T may be incident on the pixel array PA. The image sensor 100 may generate a pixel signal for a distance measurement of the target T, on the basis of the incident optical signal.

The control register block 1110 may generally control the operation of the image sensor 100. For example, the control register block 1110 may transmit operating signals directly to the timing generator 1120, the ramp signal generator 1160 and the buffer 500.

The timing generator 1120 may generate a signal that serves as a reference for the operating timing of various components of the image sensor 100. The operating timing reference signal generated by the timing generator 1120 may be transferred to the row driver 1130, the readout circuit 1150, the ramp signal generator 1160, and the like.

The ramp signal generator 1160 may generate and transmit a ramp signal used in the readout circuit 1150. For example, the readout circuit 1150 may include a correlated double sampler (CDS), a comparator, or the like, and the ramp signal generator 1160 may generate and transmit the ramp signal used for the correlated double sampler (CDS), the comparator, or the like.

The buffer 500 may include, for example, a latch. The buffer 500 may temporarily store an image signal IMS to be provided to outside, and transmit the image signal IMS to an external memory or to an external device. The buffer 500 may include, for example, eMRAM (embedded MRAM) or the like. However, the embodiment according to the technical ideas of the present invention is not limited thereto, and the buffer 500 may also include a memory such as a DRAM or a SRAM.

The pixel array PA may sense external images. The pixel array PA may include a plurality of pixels (or unit pixels). The pixel array PA may include tab circuits made up of a plurality of photogates. The row driver 1130 may selectively activate a row of the pixel array PA.

The readout circuit 1150 may sample the pixel signal PS provided from the pixel array PA, compare it to the ramp signal, and then convert the analog image signal (data) into a digital image signal (data) on the basis of the results of the comparison. For example, the readout circuit 1150 may output a pixel signal PS.

Referring to FIG. 3, the buffer 500 may include a first memory device 510. The first memory device 510 may be, for example, an eMRAM (embedded MRAM). For example, the buffer 500 may include a memory element built in the image sensor 100, along with other logic elements. Here, the buffer 500 may not exist as a single/separate item, but may be built into the image sensor 100. An area occupied by the buffer 500 in the image sensor 100, the cost of consumption, and the power consumption can be reduced, accordingly. The buffer 500 may transfer the stored image signal IMS to the image signal processor 600 in the image sensor 100.

The image signal processor 600 may perform image processing on the transferred image signal IMS. For example, the image signal processor 600 may extract depth information of the incident optical signal on the basis of the image signal IMS. The image signal processor 600 may output an image signal IMS' generated by performing the image processing.

Figure 4:
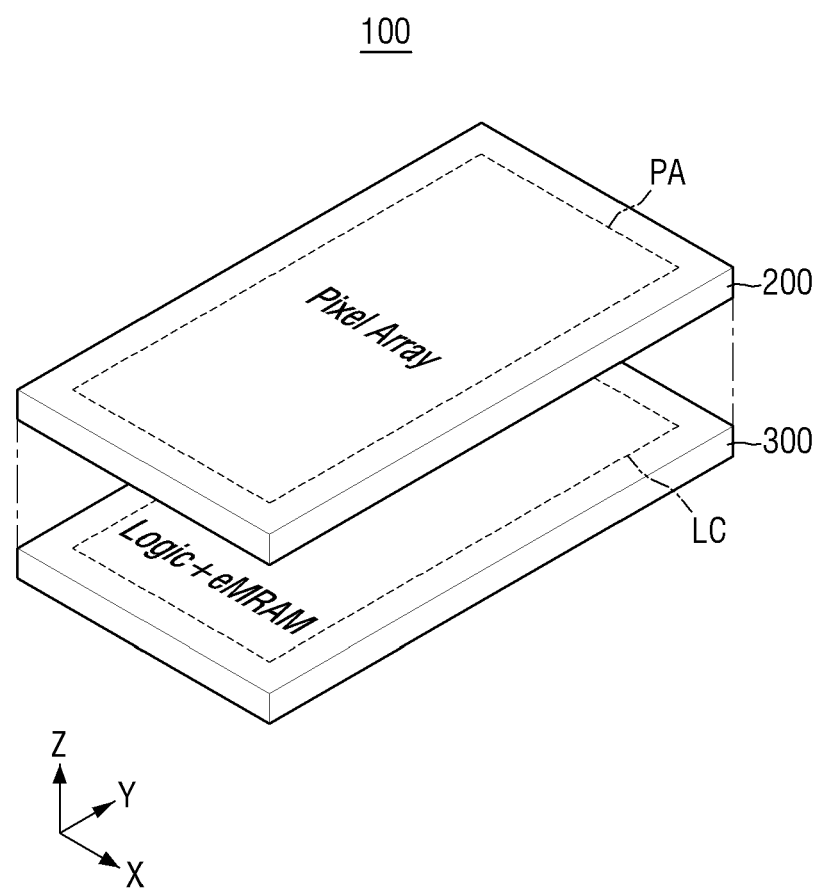
FIG. 4 is a diagram showing a conceptual layout of an image sensor according to some embodiments.
Figure 5:
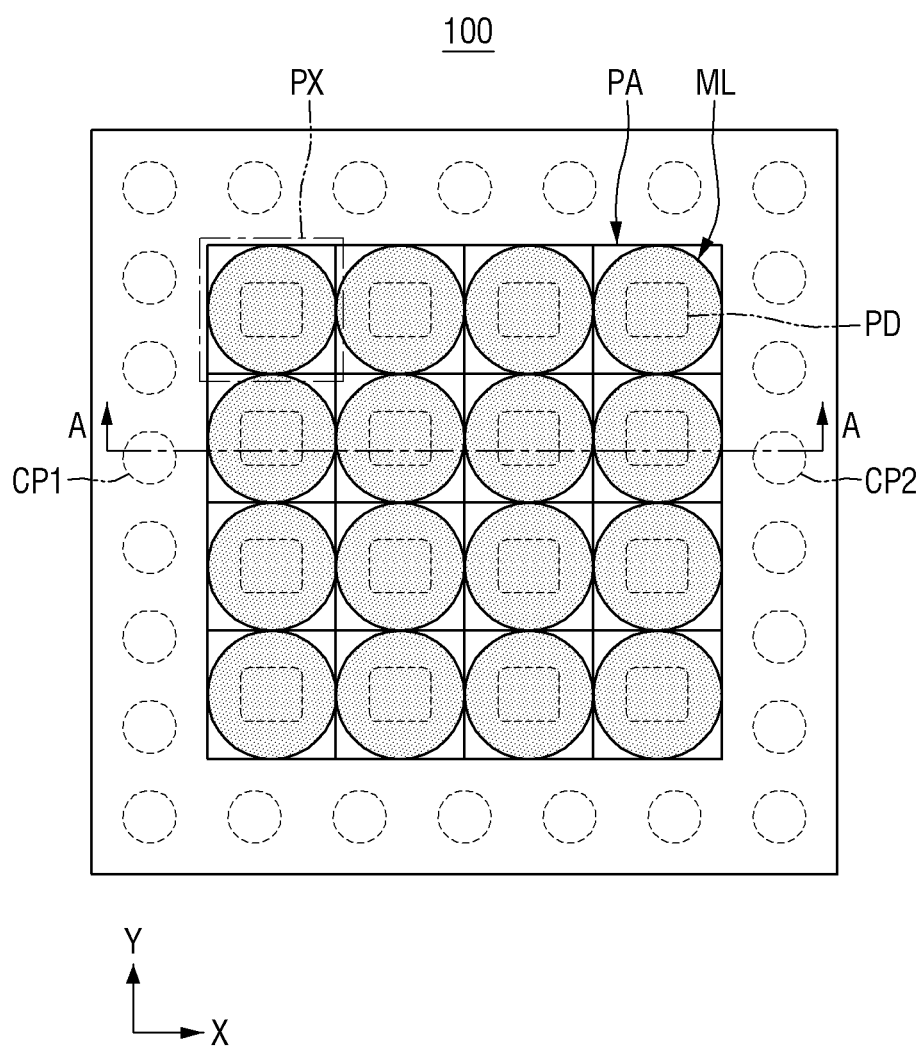
FIG. 5 is a top view of the image sensor of FIG. 4.

FIG. 4 is a diagram showing a conceptual layout of an image sensor according to some embodiments. FIG. 5 is a top view of the image sensor of FIG. 4.

Referring to FIG. 4, the image sensor 100 of this embodiment may include an upper chip 200 and a lower chip 300 which are stacked together. A plurality of pixels may be placed on the upper chip 200 in a two-dimensional array structure. For example, the upper chip 200 may include a pixel array PA. The lower chip 300 may include a logic region LC and a memory region. The lower chip 300 is placed below the upper chip 200 and may be electrically connected to the upper chip 200. The lower chip 300 may allow the pixel signal transferred from the upper chip 200 to be transmitted to the logic region LC of the lower chip 300.

As used herein, components described as being "electrically connected" are configured such that an electrical signal can be transferred from one component to the other (although such electrical signal may be attenuated in strength as it is transferred and may be selectively transferred).

Logic elements may be placed in the logic region LC of the lower chip 300. The logic elements may include circuits for processing the pixel signal received from the pixel. For example, the logic elements may include the control register block 1110, the timing generator 1120, the row driver 1130, the readout circuit 1150, the ramp signal generator 1160, and the image signal processor 600 illustrated in FIG. 2.

A magnetic random access memory (MRAM) may be placed in the memory region of the lower chip 300. For example, a large number of MRAM cells may be placed in the memory region in a two-dimensional array structure. The unit cell of the MRAM cell may include a cell transistor and an MTJ (magnetic tunnel junction) structure.

An eMRAM may be placed in the memory region of the lower chip 300. For example, the buffer 500 may include the eMRAM. The MRAM of the memory region may be formed in an embedded form. For example, the logic elements of the logic region and the MRAM of the memory region may be formed together through a CMOS process.

The MRAM of the lower chip 300 may be used as an image buffer memory for storing frame images. Therefore, the image sensor 100 may temporarily store the frame image and perform signal processing using the MRAM, thereby minimizing a zello effect and improve the operating characteristics of the image sensor 100. Also, since the MRAM of the image sensor 100 is formed together with the logic elements in the embedded form, the fabricating process may be simplified, and the size of the product may be reduced.

For example, the yield of the image sensor 100 may be increased and the fabricating cost may be reduced through the eMRAM.

Also, since the buffer 500 as the MRAM is placed on the lower chip 300, all the pixel signals PS transferred from the readout circuit 1150 may be stored in the buffer 500. For example, when the pixel signal PS is measured several times, there may be an overload to process the image signal IMS transferred to the image signal processor 600 or the image signal IMS' transferred to the application processor 10 once. For example, the image signals IMS or IMS' may be too much to be directly processed without buffering the image signal IMS in the image signal processor 600 or the image signal IMS' in the application processor 10. Since the buffer 500 stores all the pixel signals PS transferred from the readout circuit 1150 and transfers the pixel signals to the image signal processor 600 and application processor 10 from the buffer 500, overload of the image sensor 100 and the application processor 10 may be reduced. Also, because the image signal processor 600 performs image processing on the image signal IMS, the image processing performed by the application processor 10 may be reduced.

Referring to FIG. 5, a pixel array PA may be placed on the upper face of the image sensor 100. For example, the pixel array PA may be placed on the upper face of the upper chip 200 of the image sensor 100. Here, a first contact plug CP1 and a second contact plug CP2 which connect the upper chip 200 and the lower chip 300 may be placed in an external region of the region in which the pixel array PA is placed, e.g., in a plan view. A microlens ML may be placed in the region in which the pixel array PA is placed, e.g., in the plan view.

Here, the pixel PX may be defined as a region that accepts light. For example, the pixel PX may be defined as a region of the image sensor 100 in which the microlens ML is placed. For example, the pixel array PA may have a plurality of pixels PX arranged in a matrix form along the first direction X and the second direction Y. For example, the pixel PX may be defined as a region in which a photoelectric conversion layer PD into which light is incident is placed. For example, each pixel PX may include a photoelectric conversion layer PD, and circuit elements electrically connected to the photoelectric conversion layer PD.

Figure 6:
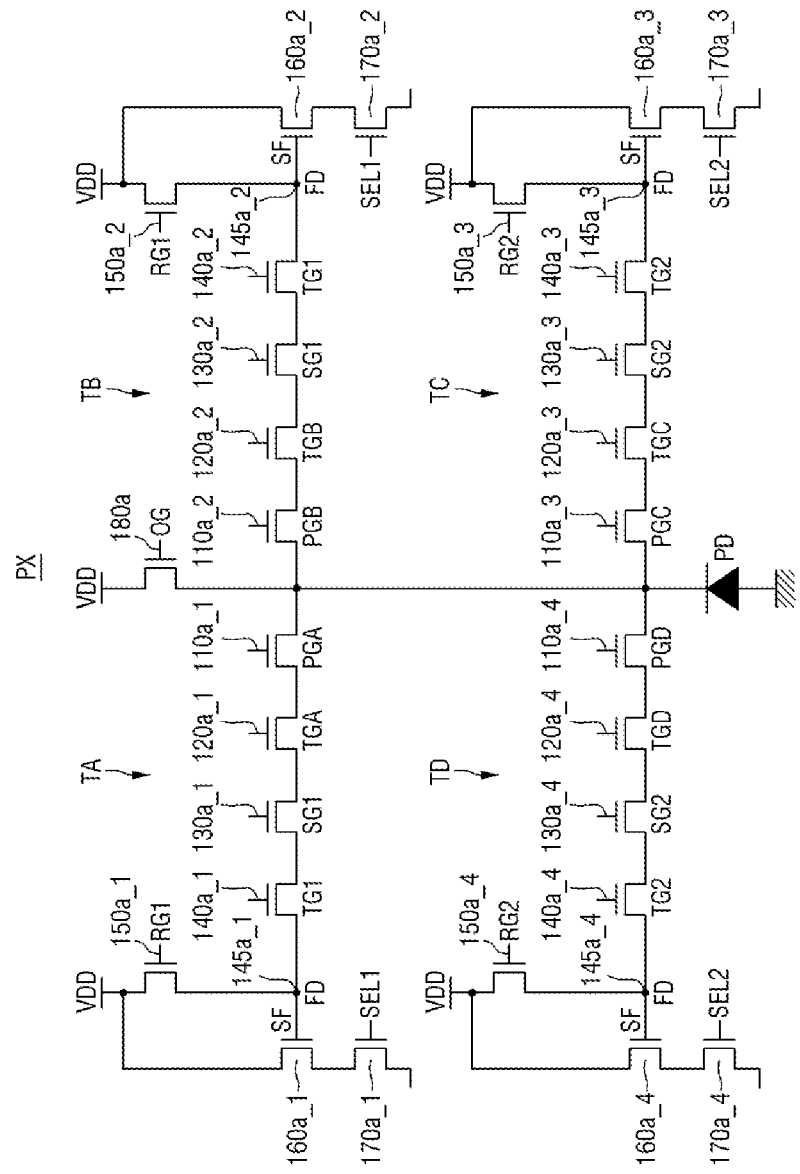
FIG. 6 is a circuit diagram of a pixel according to some embodiments.
Figure 7:
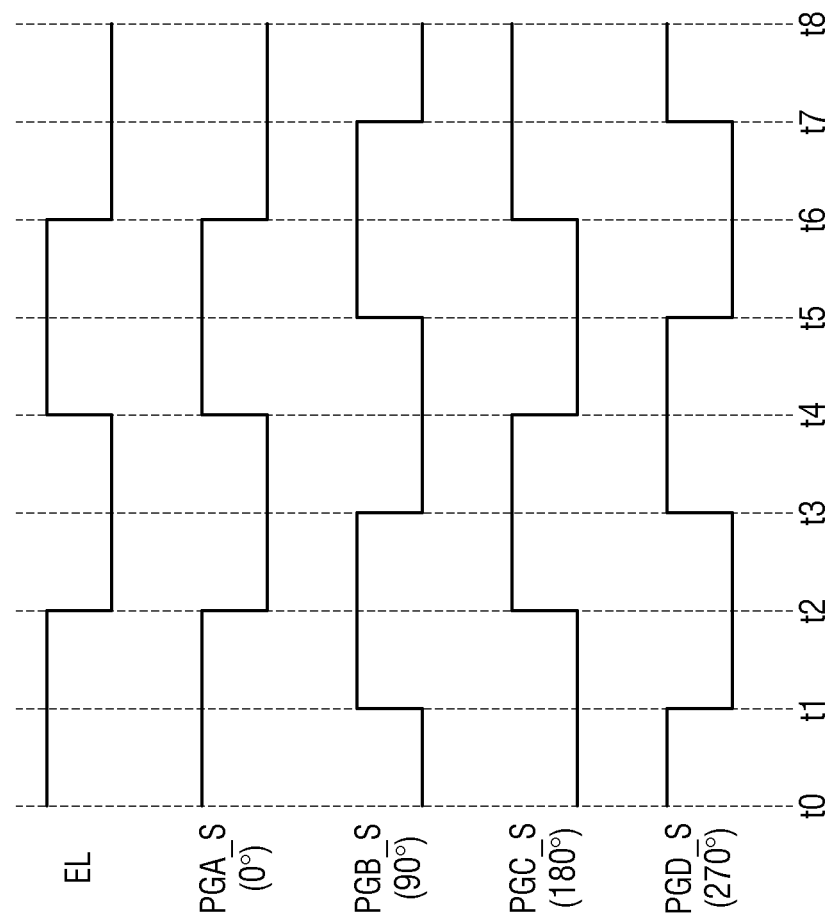
FIG. 7 is a timing diagram of a gate signal applied to a photogate of the pixel of FIG. 6.

FIG. 6 is a circuit diagram of the pixel according to some embodiments. FIG. 7 is a timing diagram of the gate signal applied to a photogate of the pixel of FIG. 6.

Referring to FIG. 6, the pixel PX may have a 4-tab circuit structure. For example, the photoelectric conversion layer PD of the pixel PX may be electrically connected to four circuits. The four circuits may share a single photoelectric conversion layer PD.

The pixel PX may include a first tab circuit TA, a second tab circuit TB, a third tab circuit TC, and a fourth tab circuit TD. The first tab circuit TA, the second tab circuit TB, the third tab circuit TC, and the fourth tab circuit TD may commonly share the photoelectric conversion layer PD.

The first tab circuit TA may include a photogate 110a_1 that generates the electric charge, and a gate that stores and transmits the electric charge. The gate that stores and transfers the electric charge may include a tab transmission gate 120a_1, a storage gate 130a_1, a transmission gate 140a_1, a reset gate 150a_1, a source follower gate 160a_1, a selection gate 170a_1, and the like.

Also, the second tab circuit TB may include a photogate 110a_2 that generates electric charge, and a gate that stores and transmits the electric charge. The gate that stores and transmits the electric charge may include a tab transmission gate 120a_2, a storage gate 130a_2, a transmission gate 140a_2, a reset gate 150a_2, a source follower gate 160a_2, a selection gate 170a_2, and the like.

A third tab circuit TC may also include a photogate 110a_3 that generates electric charge, and a gate that stores and transmits the electric charge. The gate that stores and transmits the electric charge may include a tab transmission gate 120a_3, a storage gate 130a_3, a transmission gate 140a_3, a reset gate 150a_3, a source follower gate 160a_3, a selection gate 170a_3, and the like.

Also, a fourth tab circuit TD may also include a photogate 110a_4 that generates electric charge, and a gate that stores and transmits the electric charge. The gate that stores and transmits the electric charge may include a tab transmission gate 120a_4, a storage gate 130a_4, a transmission gate 140a_4, a reset gate 150a_4, a source follower gate 160a_4, a selection gate 170a_4, and the like.

For example, the tab transmission gate 120a_1, the storage gate 130a_1, the transmission gate 140a_1, the reset gate 150a_1, the source follower gate 160a_1, and the selection gate 170a_1 may be the readout circuit 1150 of the image sensor 100 of FIG. 2.

The storage gate 130a_1 may be a charge storage structure which may temporarily store the electric charge before the electric charge is transferred to the floating diffusion region 145a_1. For example, the storage gate 130a_1 may store the electric charge transmitted from the photoelectric conversion layer PD through the photogate 110a_1. A storage diode may be further electrically connected to a lower part of the storage gate 130a_1. However, the embodiment of the present invention is not limited thereto, and the pixel PX may not include the storage gate 130a_1 but may include a storage node instead. Other storage gates 130a_2, 130a_3, and 130a_4 may also be substituted with storage nodes.

The tab structure of the pixel PX may be determined depending on how many tabs are connected in the pixel PX. The tabs may transfer the generated electric charge to the electric charge storage structure differently for each phase. For example, the tab structure may be classified into a 1-tab structure, a 2-tab structure, and a 4-tab structure. The 1-tab structure may transfer the electric charge for each phase of 0 degree, 90 degrees, 180 degrees, and 270 degrees, using a single tab circuit, e.g., four separate times for one cycle information. The 2-tab structure may transfer electric charge in phases of 0 to 180 degrees and may transfer electric charge in phases of 90 and 270 degrees, using two tab circuits, e.g., two separate times for one cycle information. The 4-tab structure may transfer the electric charge in all phases, using the four tab circuits, e.g., one cycle information at a time. The 4-tab structure may operate at a speed faster than the 2-tab structure and the 1-tab structure. The pixels of the 2-tab and 4-tab structures may have multi-tab pixel structures.

Referring to FIG. 7, an optical signal EL may correspond to a signal of light emitted from the light source 1140. A first gate signal PGA_S may have the same phase as the optical signal EL, and the first gate signal PGA_S may be applied to the photogate 110a_1. A second gate signal PGB_S may have a phase difference of 90 degrees from the optical signal EL, and the second gate signal PGB_S may be applied to the photogate 110a_2. A third gate signal PGC_S may have a phase difference of 180 degrees from the optical signal EL, and the third gate signal PGC_S may be applied to the photogate 110a_3. A fourth gate signal PGD_S has a phase difference of 270 degrees from the optical signal EL, and the fourth gate signal PGD_S may be applied to the photogate 110a_4.

As each of the first gate signal PGA_S, the second gate signal PGB_S, the third gate signal PGC_S, and the fourth gate signal PGD_S is applied to each of the photogate 110a_1, the photogate 110a_2, the photogate 110a_3 and the photogate 110a_4, the electric charge transferred from the photoelectric conversion layer PD may be stored in the storage gate 130a_1, the storage gate 130a_2, the storage gate 130a_3, and the storage gate t 130a_4.

Also, the electric charge stored in the storage gate 130a_1, the storage gate 130a_2, the storage gate 130a_3, and the storage gate 130a_4 may be converted through each of the tab circuits TA, TB, TC, and TD, and may be output as the pixel signal PS.

For example, a single pixel PX may store the electric charge transferred from the photoelectric conversion layer PD in the storage gate 130a_1, the storage gate 130a_2, the storage gate 130a_3, and the storage gate 130a_4 in a single sensing operation. Also, the pixel PX may convert the electric charge stored in the storage gate 130a_1, the storage gate 130a_2, the storage gate 130a_3, and the storage gate 130a_4 through each of the tab circuits TA, TB, TC, and TD to output the pixel signal PS. For example, the output pixel signal PS may include a larger amount of data than the pixel signal when image sensing is performed using a single tab circuit.

Moreover, the pixel PX may be measured with different frequencies. For example, the pixel PX may output the pixel signal PS as a result of measuring an optical signal using a frequency of 80 MHz, and/or may output the pixel signal PS as a result of measuring the optical signal using a frequency of 100 MHz.

Further, the pixels PX may output the pixel signal PS with different phases of the first gate signal PGA_S, the second gate signal PGB_S, the third gate signal PGC_S, and the fourth gate signal PGD_S. For example, the second gate signal PGB_S may have a phase difference of 180 degree from the optical signal EL, and the third gate signal PGC_S may have a phase difference of 90 degree from the optical signal EL. However, the embodiment according to the technical ideas of the present invention is not limited thereto.

For example, since the pixel signal PS is measured through each of the tab circuits TA, TB, TC, and TD using different frequencies through gate signals having different phases, the pixel signal PS may include more data/information.

Figure 8:
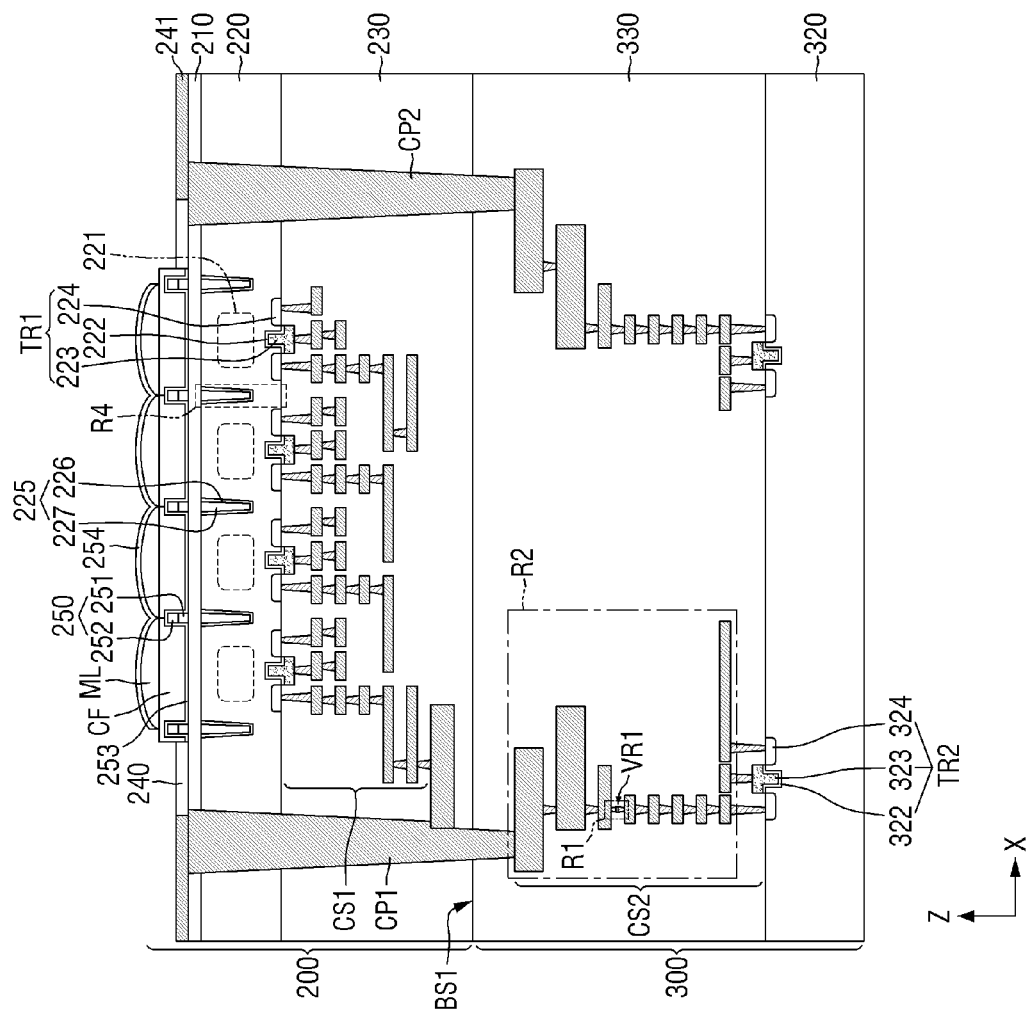
FIG. 8 is a cross-sectional view of an image sensor taken along a line A-A of FIG. 5.
Figure 9:
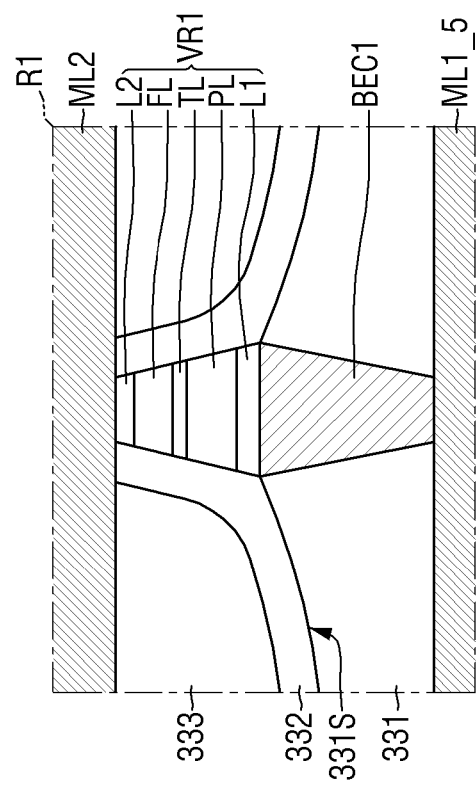
FIG. 9 is an enlarged view of a region R1 of FIG. 8.
Figure 10:
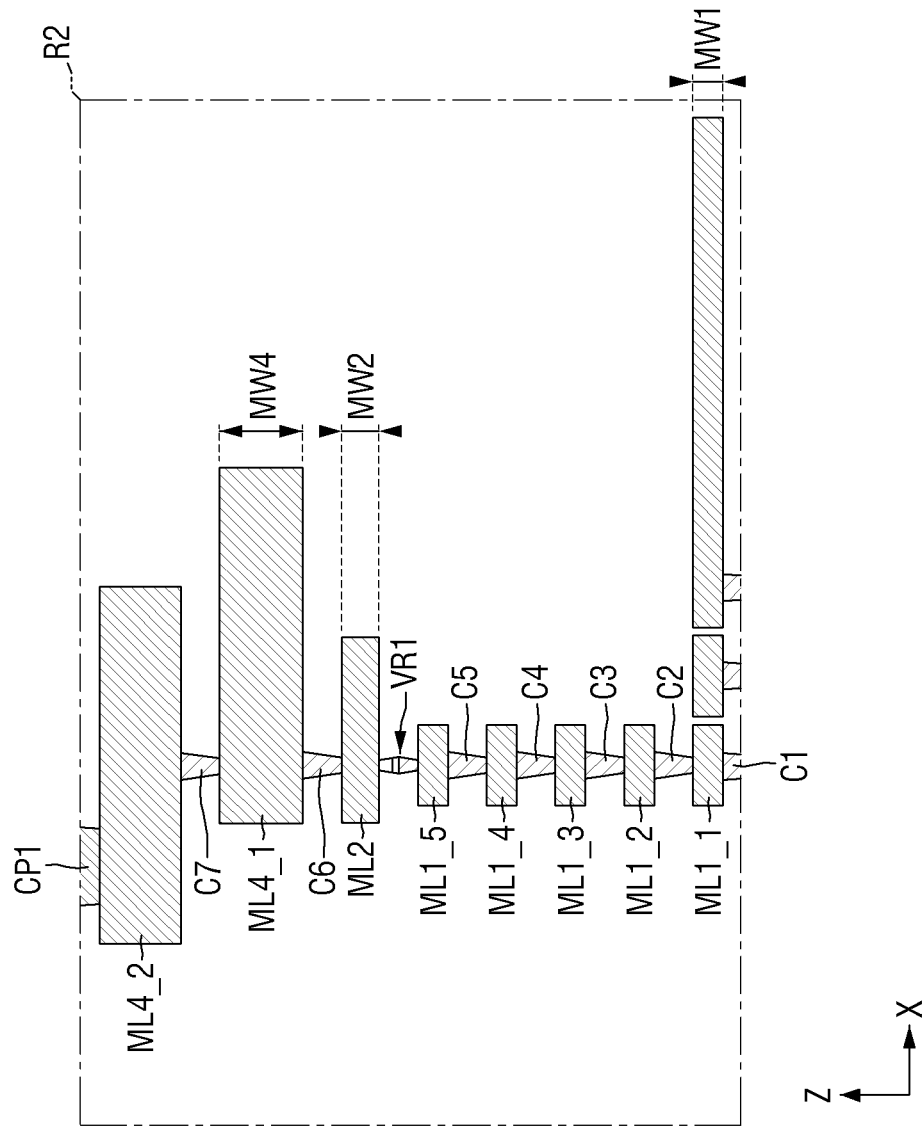
FIG. 10 is an enlarged view of a region R2 of FIG. 8.

FIG. 8 is a cross-sectional view of an image sensor taken along a line A-A of FIG. 5. FIG. 9 is an enlarged view of a region R1 of FIG. 8. FIG. 10 is an enlarged view of a region R2 of FIG. 8.

Referring to FIG. 8, the image sensor 100 may include an upper chip 200 and a lower chip 300. The upper chip 200 and the lower chip 300 may be stacked together/sequentially. For example, the upper chip 200 may be stacked on the lower chip 300.

The upper chip 200 may include a semiconductor substrate 220, a photoelectric conversion layer 221, a first transistor TR1, a pixel separation pattern 225, and the like.

The semiconductor substrate 220 may be, for example, bulk silicon or SOI (silicon-on-insulator). The semiconductor substrate 220 may be a silicon substrate or may include and/or be formed of another material such as silicon germanium, indium antimonide, lead tellurium compounds, indium arsenic, indium phosphide, gallium arsenide or gallium antimonide.

Alternatively, the semiconductor substrate 220 may have an epitaxial layer formed on a base substrate. The semiconductor substrate 220 may include front and back sides that are opposite to each other. For example, the front and back sides of the semiconductor substrate 220 may be respectively the bottom surface and the top surface of the semiconductor substrate 220 shown in FIG. 8. In some embodiments, the back side of the semiconductor substrate 220 may be a light-receiving face on which light is incident.

In some embodiments, the first transistor TR1 may be placed on the front side of the semiconductor substrate 220. The first transistor TR1 may be, for example, a transmission transistor, a reset transistor, a source follower transistor, a selection transistor, or the like that make up the unit pixel of the image sensor. For example, the gate electrode of the first transistor TR1 may be a tab transmission gate 120a_1, a storage gate 130a_1, a transmission gate 140a_1, a reset gate 150a_1, a source follower gate 160a_1, a selection gate 170a_1, or the like.

The first transistor TR1 may include a gate insulating film 222, a gate electrode 223, and an impurity injection region 224. The gate insulating film 222 may be formed along a trench formed in the semiconductor substrate 220. The gate electrode 223 may fill a region defined by the gate insulating film 222. The impurity injection region 224 may be formed by doping impurities inside the semiconductor substrate 220. Here, the gate electrode 223 may act as a gate of the first transistor TR1, and the impurity injection region 224 may act as a source/drain of the first transistor TR1.

The pixel separation pattern 225 may be placed inside the semiconductor substrate 220. The pixel separation pattern 225 may define a plurality of unit pixels. The unit pixels may be arranged two-dimensionally, e.g., in a horizontal plane, and in a matrix form in a plan view. For example, the pixel separation pattern 225 may form a lattice, e.g., in a plan view, to separate the unit pixels from each other. The pixel separation pattern 225 may be formed by burying an insulating material in a deep trench formed in the semiconductor substrate 220.

In some embodiments, the pixel separation pattern 225 may include an insulating spacer film 226 and a conductive filling pattern 227. The insulating spacer film 226 may conformally extend along the side faces of the trench in the semiconductor substrate 220. The conductive filling pattern 227 may be formed on the insulating spacer film 226 to fill a part of the trench in the semiconductor substrate 220.

The unit pixel may include a photoelectric conversion layer 221. The photoelectric conversion layer 221 may be formed inside the semiconductor substrate 220. The photoelectric conversion layer 221 may generate electric charge in proportion to an amount of light incident into the photoelectric conversion layer 221, e.g., from the outside. The photoelectric conversion layer 221 may be formed by doping impurities in the semiconductor substrate 220. For example, when the semiconductor substrate 220 is doped with a p-type impurity, the photoelectric conversion layer 221 may be doped with an n-type impurity. The photoelectric conversion layer 221 may correspond to the photoelectric conversion layer PD of FIG. 6. For example, four tab circuits TA, TB, TC, and TD may be electrically connected commonly to the photoelectric conversion layer 221.

The upper chip 200 may include a surface insulating layer 210, a passivation layer 240, a grid pattern 250, a first liner 253, a color filter CF, a microlens ML, a second liner 254, and the like.

The surface insulating layer 210 may be stacked on the back side of the semiconductor substrate 220. The passivation layer 240 may be stacked on the surface insulating layer 210. The grid pattern 250, the first liner 253, the color filter CF, the microlens ML and the second liner 254 may be placed in the region defined by the surface insulating layer 210.

The color filter CF may be formed on the surface insulating layer 210. The color filter CF may include a plurality of color filter patterns, and the color filter patterns may be respectively arranged to unit pixels. The color filter patterns may be arranged two-dimensionally, e.g., in a horizontal plane, and may have a matrix form in a plan view. A plurality of micro lenses ML may be formed on the color filter CF. The micro lenses ML may be respectively arranged to the unit pixels. The microlens ML have a convex shape, and may have a predetermined radius of curvature. The microlens ML may concentrate light incident on the photoelectric conversion layer PD accordingly. The microlens ML may include and/or be formed of, for example, but is not limited to, light-emissive resin.

The grid pattern 250 may be formed between the color filter patterns CF. The grid pattern 250 may be formed on the surface insulating layer 210. The grid pattern 250 may include and/or be formed of, for example, a metal pattern 251 and a low refractive index pattern 252. The metal pattern 251 and the low refractive index pattern 252 may be stacked sequentially on the surface insulating layer 210.

The first liner 253 may be formed on the surface insulating layer 210 and the grid pattern 250. The first liner 253 may extend along the surfaces of the surface insulating layer 210 and the grid pattern 250. The first liner 253 may include and/or be formed of, for example, but is not limited to, aluminum oxide.

The second liner 254 may extend along the surface of the microlens ML. The second liner 254 may include or be formed of, for example, but is not limited to, an inorganic oxide film (e.g., silicon oxide, titanium oxide, zirconium oxide, hafnium oxide, or a combination thereof).

The upper chip 200 may include an inter-wiring insulating layer 230, and a first connection structure CS1. The first connection structure CS1 may be formed inside the inter-wiring insulating layer 230. Here, the connection structure may include a plurality of metal layers, a plurality of contacts electrically connecting the plurality of metal layers, and the like.

The first connection structure CS1 may be electrically connected to the first transistor TR1. The first connection structure CS1 may transfer an electrical signal transferred from the first transistor TR1. The first connection structure CS1 may include and/or be formed of a conductive material. For example, the first connection structure CS1 may include and/or be formed of metal such as copper and/or lead.

The lower chip 300 may be placed below the upper chip 200. For example, the lower chip 300 and the upper chip 200 may be in contact with each other on the first bonding face BS1. The upper chip 200 and the lower chip 300 may be connected by a first contact plug CP1 and a second contact plug CP2 which will be described below.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The lower chip 300 may include a semiconductor substrate 320, a second transistor TR2, an inter-wiring insulating layer 330, a first variable resistance element VR1, a second connection structure CS2, and the like. The second connection structure CS2 may be formed inside the inter-wiring insulating layer 330.

The semiconductor substrate 320 may be, for example, bulk silicon or SOI (silicon-on-insulator). The semiconductor substrate 320 may be a silicon substrate or may include and/or be formed of another material such as silicon germanium, indium antimonide, lead tellurium compounds, indium arsenic, indium phosphide, gallium arsenide or gallium antimonide.

A second transistor TR2 may be placed on the front side of the semiconductor substrate 320. The second transistor TR2 may be implemented in, for example, logic elements such as a control register block 1110, a timing generator 1120, a row driver 1130, a readout circuit 1150, and a ramp signal generator 1160 of the image sensor 100. The second transistor TR2 may include a gate insulating film 322, a gate electrode 323, and an impurity injection region 324.

The second transistor TR2 and the first contact plug CP1 may be electrically connected by the second connection structure CS2 of the lower chip 300.

Referring to FIG. 9, a first contact BEC1 and the first variable resistance element VR1 may be placed between a first metal layer ML1_5 and a second metal layer ML2. For example, the first contact BEC1 and the first variable resistance element VR1 may electrically connect the first metal layer ML1_5 and the second metal layer ML2. For example, the first contact BEC1 and the first variable resistance element VR1 may be interposed between the first metal layer ML1_5 and the second metal layer ML2.

The first contact BEC1 may be placed on the first metal layer ML1_5 and may be directly connected to the first metal layer ML1_5. Although the first contact BEC1 may have a shape in which a width of a lower part is narrower than a width of an upper part, the embodiment according to the technical idea of the present invention is not limited thereto. The first variable resistance element VR1 may be formed on the first contact BEC1. The first variable resistance element VR1 may contact and electrically connect the first contact BEC1 and the second metal layer ML2.

The inter-wiring insulating layer 330 may include a plurality of layers. For example, the inter-wiring insulating layer 330 may include a first insulating layer 331, a capping film 332, and a second insulating layer 333. The first insulating layer 331 may be formed on the first metal layer ML1_5. The first insulating layer 331 may be formed to surround the first contact BEC1. For example, the first insulating layer 331 may be formed along and contact the side walls of the first contact BEC1 and the upper face of the first metal layer ML1_5. A first insulating layer upper face 331S of the first insulating layer 331 may have a shape inclining downward in a direction receding from the first contact BEC1.

The capping film 332 may be formed along the upper face 331S of the first insulating layer and the side walls of the first variable resistance element VR1. For example, the capping film 332 may be formed to surround the first variable resistance element VR1. The capping film 332 may protect the first variable resistance element VR1 from the outside. The capping film 332 may be formed along the upper face 331S of the first insulating layer, and may have a inclining downward in a direction receding from the first variable resistance element VR1.

The second insulating layer 333 may be formed on the capping film 332. For example, the second insulating layer 333 may be formed between the capping film 332 and the second metal layer ML2.

The first variable resistance element VR1 may be an MTJ (magnetic tunnel junction) element. In this case, the first variable resistance element VR1 may be a non-volatile memory element. The first variable resistance element VR1 may store data temporarily, and the data stored in the first variable resistance element VR1 may be read.

The first variable resistance element VR1 may include a first layer L1, a fixed layer PL, a tunnel layer TL, a free layer FL, and a second layer L2. The first layer L1, the fixed layer PL, the tunnel layer TL, the free layer FL, and the second layer L2 may be stacked sequentially.

The first layer L1 may be formed on the first contact BEC1. The first layer L1 may include and/or be formed of a metal nitride such as tantalum nitrides, titanium nitrides, and tungsten nitrides.

The fixed layer PL may be formed on the first layer L1. The fixed layer PL may include and/or be formed of ferromanganese (FeMn), manganese iridium (IrMn), manganese platinum (PtMn), manganese oxide (MnO), manganese sulfide (MnS), tellurium manganese (MnTe), manganese fluoride (MnF2), iron fluoride (FeF2), iron chloride (FeCl2) iron oxide (FeO), cobalt chloride (CoCl2), cobalt oxide (CoO), nickel chloride (NiCl2), nickel oxide (NiO), chromium (Cr), and/or the like.

The tunnel layer TL may be formed on the fixed layer PL. The tunnel layer TL may include and/or be formed of aluminum oxide or magnesium oxide.

The free layer FL may be formed on the tunnel layer TL. The free layer FL may include and/or be formed of a ferromagnet including at least one of iron (Fe), nickel (Ni), and cobalt (Co).

The second layer L2 may be formed on the free layer FL. The second layer L2 may include and/or be formed of a metal such as tantalum, titanium and tungsten, and/or a metal nitride such as titanium nitride or tantalum nitride.

Referring to FIG. 10, first metal layers ML1_1 to ML1_5 may be formed inside the inter-wiring insulating layer 330. The first metal layers ML1_1 to ML1_5 may be sequentially placed from the face on which the second transistor TR2 is located.

The thicknesses of each of the first metal layers ML1_1 to ML1_5 may be the same. Further, the thicknesses of the first metal layers ML1_1 to ML1_5, the second metal layer ML2, and fourth metal layers ML4_1 and ML4_2 may be different from each other. The thickness of the second metal layer ML2 may be greater than the thickness of the first metal layers ML1_1 to ML1_5. The thickness of the fourth metal layers ML4_1 and ML4_2 may be greater than the thickness of the second metal layer ML2. However, the embodiment according to the technical ideas of the present invention is not limited thereto.

The first metal layers ML1_1 to ML1_5, the second metal layer ML2, and the fourth metal layers ML4_1 and ML4_2 may be electrically connected by a plurality of contacts C1 to C7. For example, a plurality of contacts C1 to C5 may electrically connect the first metal layers ML1_1 to ML1_5 and the second transistor TR2 to each other. For example, a plurality of contacts C6 and C7 may electrically connect the second metal layer ML2 and the fourth metal layers ML4_1 and ML4_2. Here, the first metal layer ML1_5 and the second metal layer ML2 may be electrically connected by the first contact BEC1 and the first variable resistance element VR1. For example, the first variable resistance element VR1 may be one type of eMRAM.

Figure 11:
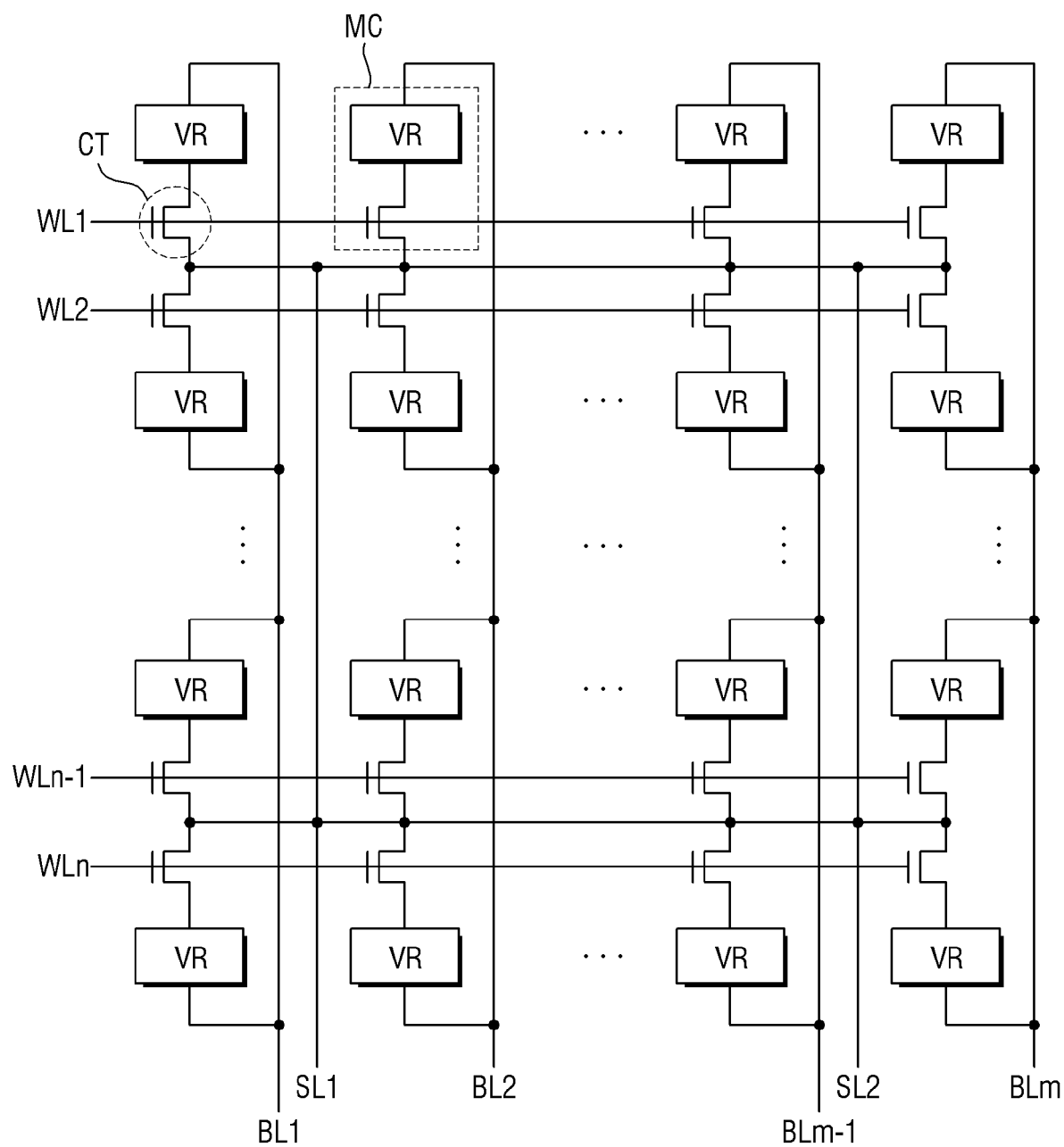
FIG. 11 is a diagram showing a memory cell array according to some embodiments.
Figure 12:
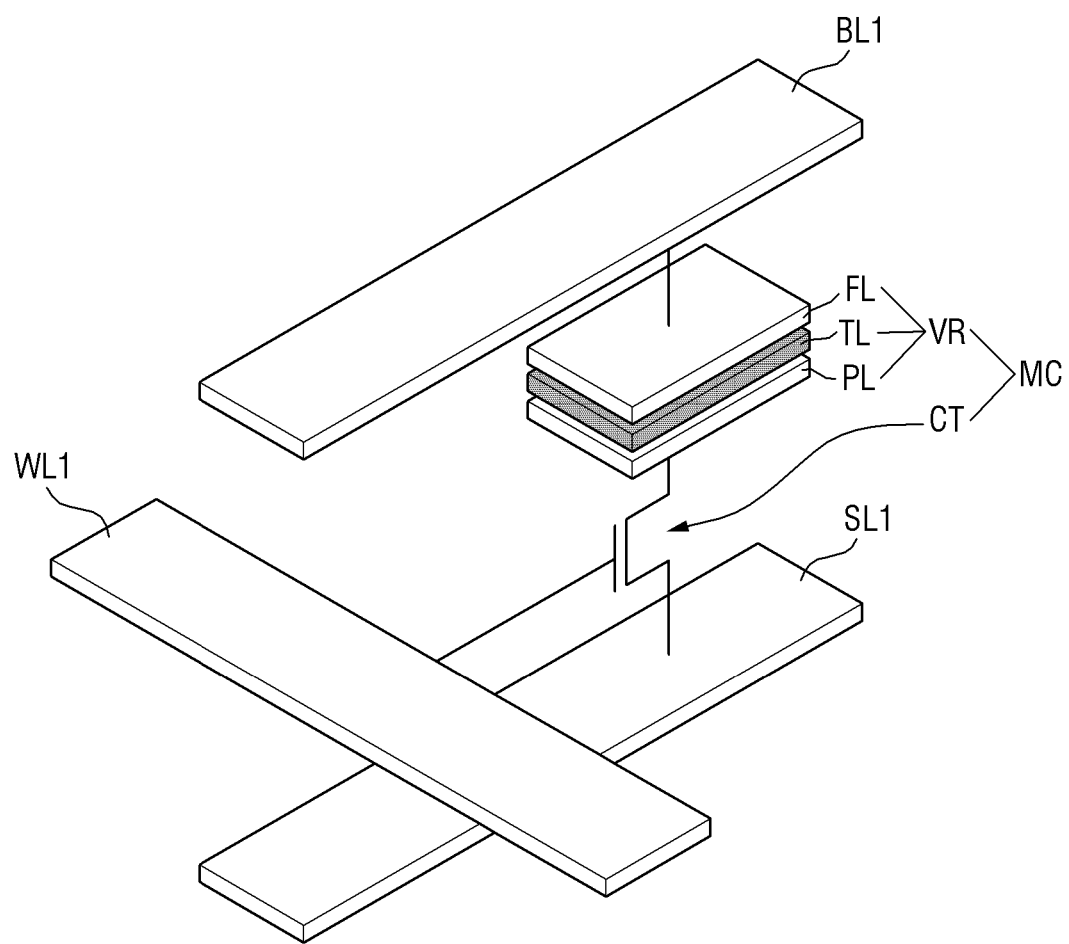
FIGS. 12 and 13 are exemplary diagrams showing memory cells of the memory cell array of FIG. 11.
Figure 13:
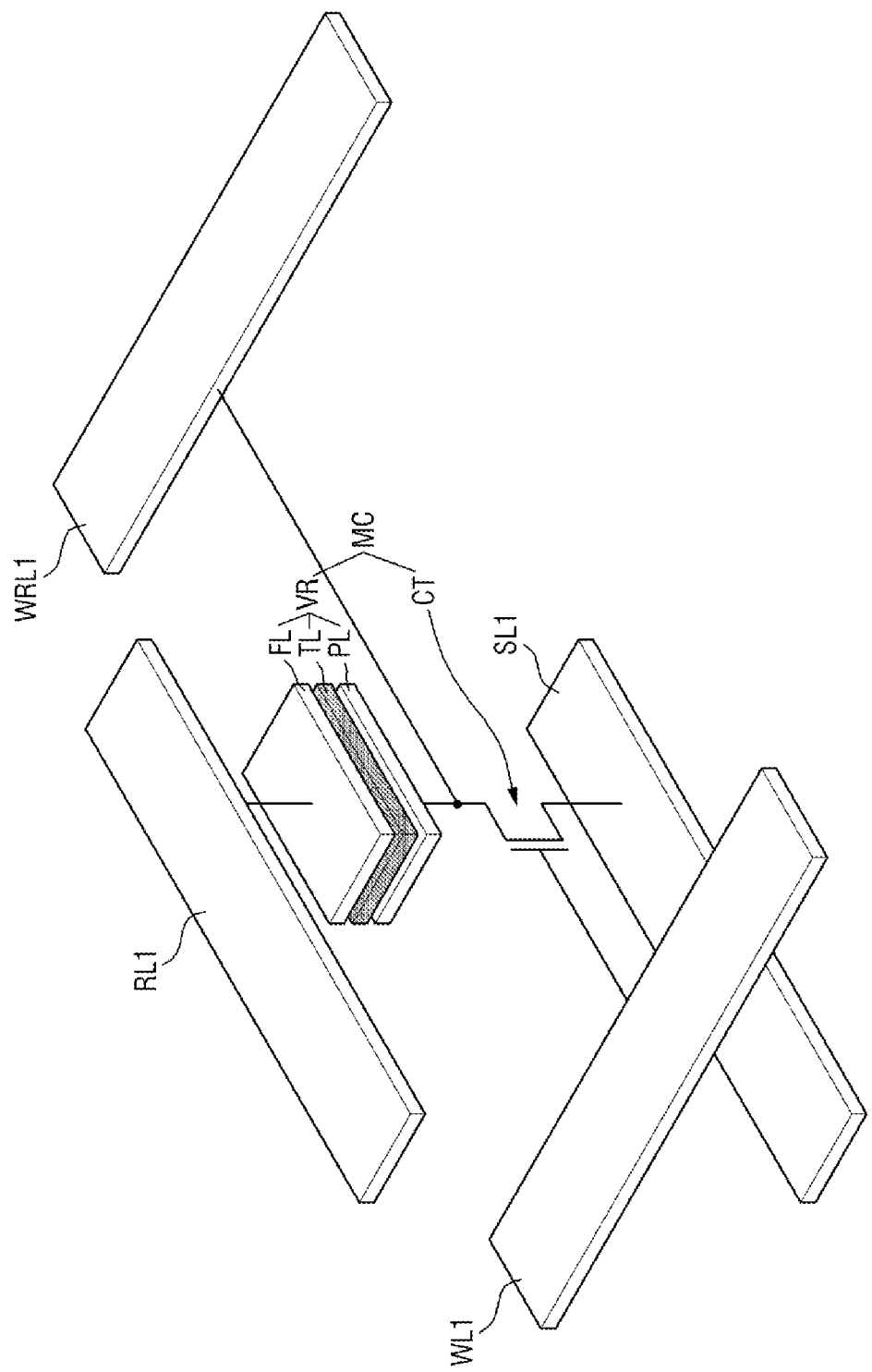
Figure 14:
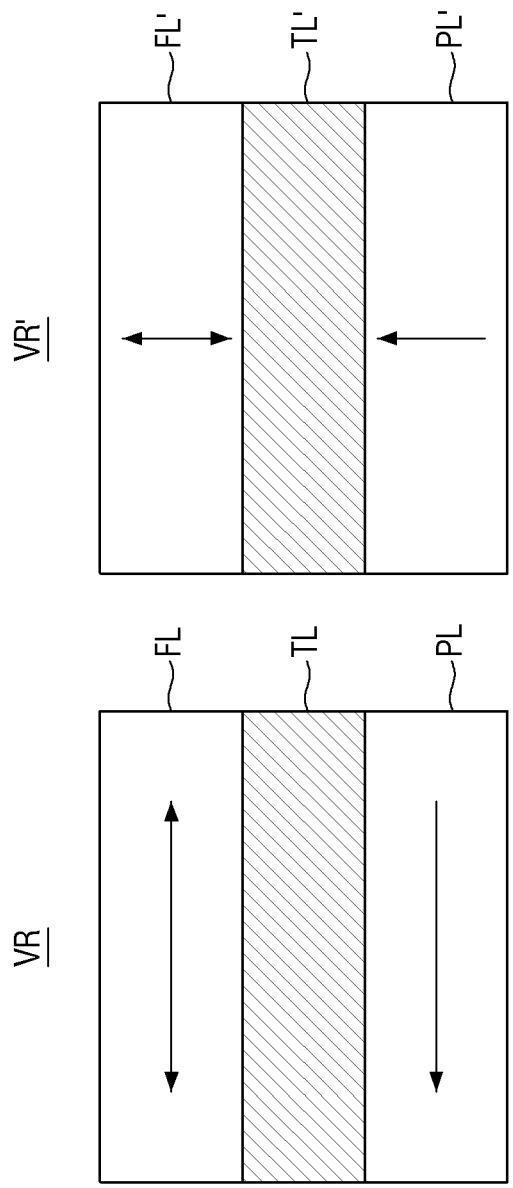
FIG. 14 is an exemplary diagram showing a variable resistance element according to some embodiments.

FIG. 11 is a diagram showing a memory cell array according to some embodiments. FIGS. 12 and 13 are exemplary diagrams showing a memory cell of the memory cell array of FIG. 11. FIG. 14 is an exemplary diagram showing a variable resistance element according to some embodiments.

Referring to FIGS. 11 and 12, the memory cell array may include a plurality of memory cells MC. The memory cells MC may be placed along a row direction and a column direction. Each of the memory cells MC may include, for example, a variable resistance element VR and a cell transistor CT. The variable resistance element VR may be the first variable resistance element VR1 described above.

Gates (gate electrodes) of cell transistors CT may be electrically connected to word lines WL1 to WLn. Gates of the cell transistor CT placed in the row direction (e.g., in the same row) may be commonly electrically connected to one word line (for example, the first word line WL1). Gates of the cell transistor CT of other rows may be electrically connected to other word lines.

One end (e.g., one source/drain terminal) of the cell transistor CT may be electrically connected to one end (a first end) of the variable resistance element VR. The other end (e.g., the other source/drain terminal) of the cell transistor CT may be connected to a source line (e.g., a source line SL1 and a source line SL2). A pair of adjacent cell transistors CT may be commonly electrically connected to one source line (e.g., the source line SL1).

A second end different from the first end of the variable resistance element VR may be electrically connected to one of bit lines BL1 to BLm. Second ends of the variable resistance elements VR arranged in the column direction may be commonly electrically connected to one bit line (for example, the first bit line BL1).

The variable resistance element VR may have one state of a low resistance state or a high resistance state, depending on the bias conditions. By adjusting the state of the variable resistance element VR to one state of the low resistance state or the high resistance state, data may be stored in the variable resistance element VR. The memory cell array of FIG. 12 may be an STT (spin transfer torque) MRAM.

Referring to FIG. 13, one end (one source/drain terminal) of the cell transistor CT may be connected to a write line WRL1. One end of the variable resistance element VR may be connected to the write line WRL1. Also, the other end of the variable resistance element VR may be connected to a read line RL1. The memory cell array of FIG. 13 may be an SOT (spin orbit torque) MRAM.

Referring to FIG. 12 again, the variable resistance element VR may include a free layer FL, a fixed layer PL, and a tunnel layer TL. For example, the free layer FL, the fixed layer PL, and the tunnel layer TL may be placed between the first bit line BL1 and the cell transistor CT. The tunnel layer TL may be placed between the free layer FL and the fixed layer PL.

Here, the first bit line BL1 may correspond to the second metal layer ML2, the first word line WL1 may correspond to a pattern of the first metal layer ML1_1, and the source line SL1 may correspond to another pattern of the first metal layer ML1_1 illustrated in FIGS. 9 and 10.

Referring to FIG. 14, a magnetization direction of the fixed layer PL may be fixed. The magnetization direction of the free layer FL may be the same as or opposite to the magnetization direction of the fixed layer PL, depending on the bias conditions.

If the magnetization direction of the free layer FL and the magnetization direction of the fixed layer PL are parallel (when they are the same direction), the resistance value of the variable resistance element VR may decrease. If the magnetization direction of the free layer FL and the magnetization direction of the fixed layer PL are anti-parallel to each other, the resistance value of the variable resistance element VR may increase.

For example, when the current flows from the free layer FL to the fixed layer PL, the electrons may move from the fixed layer PL to the free layer FL. The electrons flowing through the fixed layer PL may rotate along the magnetization direction of the fixed layer PL. The free layer FL may be magnetized by electrons that rotate along the magnetization direction of the fixed layer PL. For example, the free layer FL may be magnetized in the same direction as the magnetization direction of the fixed layer PL.

For example, when the current flows from the fixed layer PL to the free layer FL, the electrons may move from the free layer FL to the fixed layer PL. Some of the electrons injected into the fixed layer PL may be reflected from the fixed layer PL to the free layer FL. The reflected electrons may rotate by the magnetization direction of the fixed layer PL. The rotation direction of the reflected electrons may be opposite to the magnetization direction of the fixed layer PL. The free layer FL may be magnetized by electrons having rotation. For example, the free layer FL may be magnetized in the direction opposite to the magnetization direction of the fixed layer PL.

A variable resistance elements VR' may include a fixed layer PL', a free layer FL', and a tunnel layer TL'. Unlike the variable resistance element VR, the fixed layer PL' and the free layer FL' of the variable resistance element VR' may have a vertical magnetization direction.

Referring to FIG. 8 again, a first contact plug CP1 and a second contact plug CP2 may electrically connect the upper chip 200 and the lower chip 300.

The first contact plug CP1 may extend from the upper face of the semiconductor substrate 220. The first contact plug CP1 may extend to the second connection structure CS2 of the lower chip 300. The first contact plug CP1 may also be electrically connected to the first connection structure CS1 of the upper chip 200. For example, the first contact plug CP1 may be formed by filling a conductive material in a trench formed in the outer region of the upper chip 200 and the lower chip 300, and the first contact plug CP1 may connect the upper chip 200 and the lower chip 300. Further, the first contact plug CP1 may allow the upper chip 200 and the lower chip 300 to be fixed.

A pad 241 may be formed on the first contact plug CP1. The pad 241 may be electrically connected to the first contact plug CP1 to transmit and receive signals.

The second contact plug CP2 may extend from the upper face of the semiconductor substrate 220. The second contact plug CP2 may extend to the second connection structure CS2 of the lower chip 300. The second contact plug CP2 may be spaced apart from the first contact plug CP1. The second contact plug CP2 may be formed by filling a conductive material in a trench formed in the outer region of the upper chip 200 and the lower chip 300, and the second contact plug CP2 may electrically connect the upper chip 200 and the lower chip 300. Also, the second contact plug CP2 may allow the upper chip 200 and the lower chip 300 to be fixed.

A pad 241 may be formed on the second contact plug CP2. The pad 241 may be electrically connected to the second contact plug CP2 to transmit and receive signals.

Referring to FIG. 5, the first contact plug CP1 and the second contact plug CP2 may be placed in the outer region of the image sensor 100. For example, the first contact plug CP1 and the second contact plug CP2 may be placed in the outer region of the region in which the pixel array PA is placed. However, the embodiment according to the technical ideas of the present invention is not limited thereto.

Figure 15:
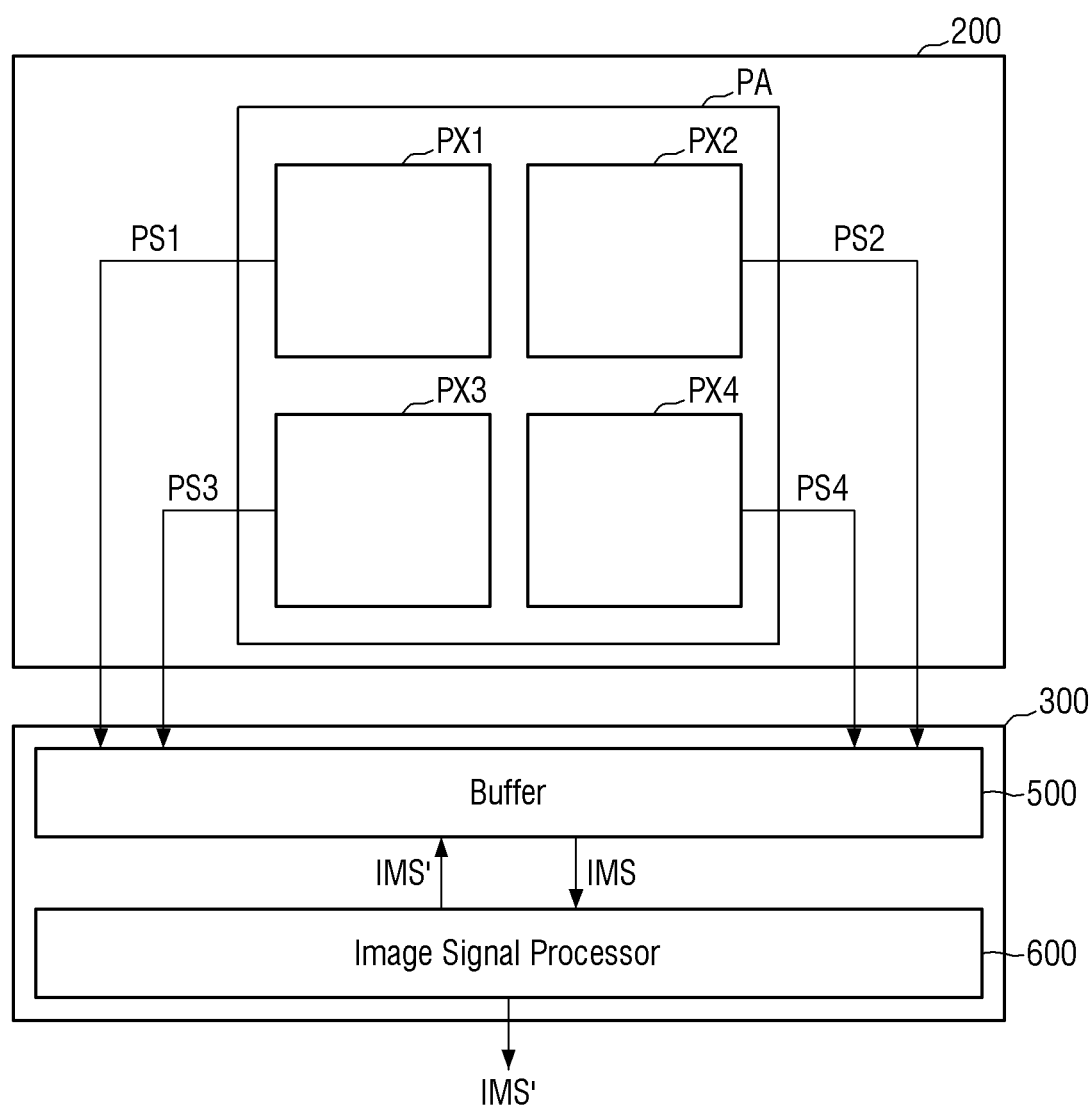
FIGS. 15 and 16 are block diagrams of an image sensor according to some embodiments.
Figure 16:
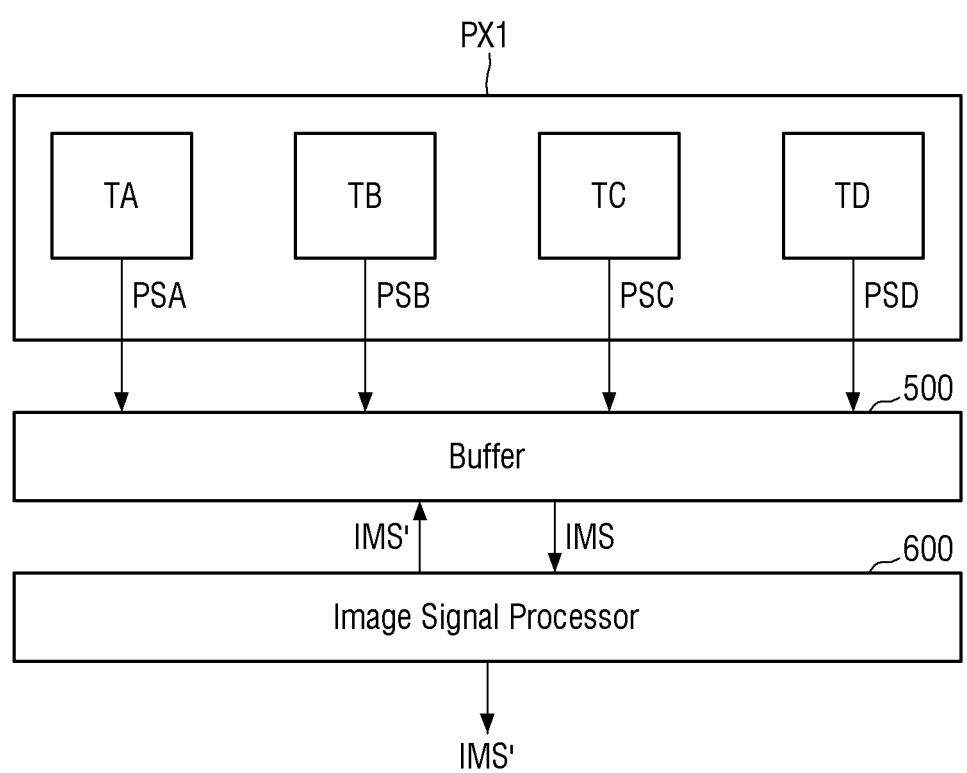

FIGS. 15 and 16 are block diagrams of an image sensor according to some embodiments.

Referring to FIG. 15, the upper chip 200 of the image sensor 100 may include a pixel array PA, and the lower chip 300 may include a buffer 500 and an image signal processor 600.

The pixel array PA may include a plurality of pixels. For example, the pixel array PA may include a first pixel PX1, a second pixel PX2, a third pixel PX3, and a fourth pixel PX4. Here, each of the first pixel PX1, the second pixel PX2, the third pixel PX3, and the fourth pixel PX4 may be the same as the pixel PX explained using FIGS. 5 and 6. For example, each pixel PX may be configured as a 4-tab circuit structure.

Referring to FIG. 16, the first pixel PX1 may include a first tab circuit TA, a second tab circuit TB, a third tab circuit TC, and a fourth tab circuit TD. The first tab circuit TA, the second tab circuit TB, the third tab circuit TC, and the fourth tab circuit TD may sense incident light, and provide a first subpixel signal PSA, a second subpixel signal PSB, a third subpixel signal PSC, and a fourth subpixel signal PSD to the buffer 500. For example, the first pixel signal PS1 of FIG. 15 may include the first subpixel signal PSA, the second subpixel signal PSB, the third subpixel signal PSC, and the fourth subpixel signal PSD.

Referencing FIG. 15 again, the first pixel PX1, the second pixel PX2, the third pixel PX3, and the fourth pixel PX4 may provide the first pixel signal PS1, the second pixel signal PS2, the third pixel signal PS3, and the fourth pixel signal PS4 to the buffer 500. The buffer 500 may store the first pixel signal PS1, the second pixel signal PS2, the third pixel signal PS3 and the fourth pixel signal PS4 which are provided. Here, the buffer 500 may include a MRAM.

The image signal processor 600 may receive the image signal IMS from the buffer 500. Here, the image signal IMS may include all the stored first pixel signal PS1, second pixel signal PS2, third pixel signal PS3, and fourth pixel signal PS4. The image signal processor 600 may perform image processing on the provided image signal IMS and output an image signal IMS'.

The image signal processor 600 may provide the image signal IMS' to the buffer 500 again. For example, the buffer 500 may store not only the first pixel signal PS1, the second pixel signal PS2, the third pixel signal PS3, and the fourth pixel signal PS4, but also an image signal IMS' obtained by correcting the signals. For example, the image signal IMS received from the buffer 500 may be modified into the image signal IMS' by the image signal processor 600.

FIGS. 17 through 20 are diagrams for explaining an image signal according to some embodiments.

Figure 17:
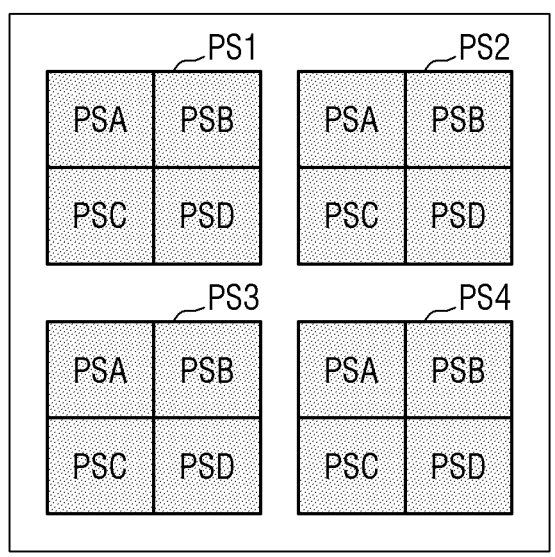
FIGS. 17 through 20 are diagrams for explaining an image signal according to some embodiments.

Referring to FIG. 17, an image signal IMS1 may be an image signal IMS stored in the buffer 500. For example, the image signal IMS1 may include all the first pixel signal PS1, the second pixel signal PS2, the third pixel signal PS3, and the fourth pixel signal PS4. Also, each pixel signal may include information of the optical signal transferred from all the tab circuits. For example, the first pixel signal PS1 may include all the first subpixel signal PSA, the second subpixel signal PSB, the third subpixel signal PSC, and the fourth subpixel signal PSD.

For example, the image signal IMS1 may be an image signal stored in the buffer 500 as a result of sensing incident light using all the pixels PX1, PX2, PX3, and PX4.

Figure 18:
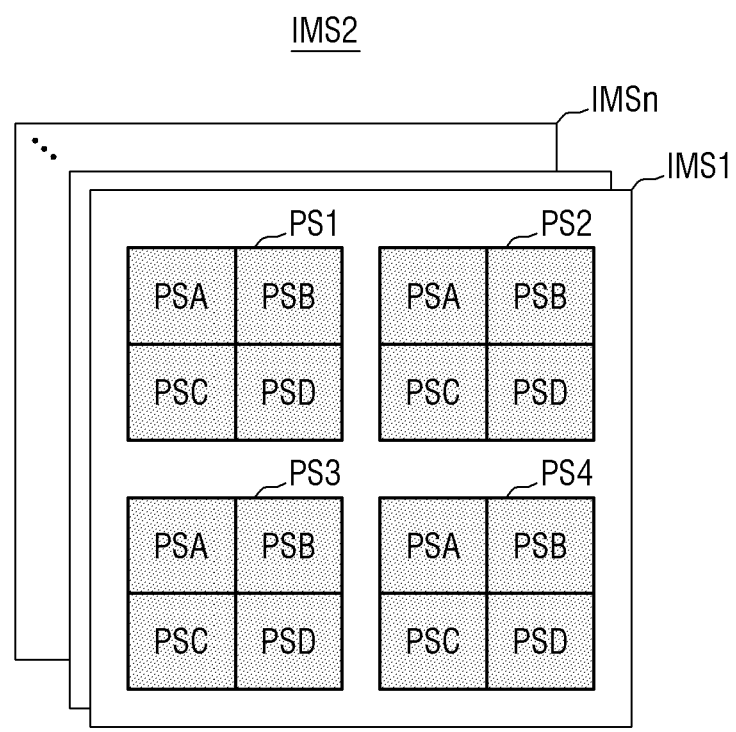

Referring to FIG. 18, the image signal IMS2 stored in the buffer 500 may include a plurality of types of image signals. For example, the image signal IMS2 may include not only the first image signal IMS1 but also other types of image signals IMSn.

Here, the image signal TMS1 may be the result of being sensed using the first frequency. However, the image signal IMSn may be the result of being sensed using a second frequency that is different from the first frequency. Also, the image signal IMSn may be the result of being sensed with different phases of the first gate signal PGA_S, the second gate signal PGB_S, the third gate signal PGC_S, and the fourth gate signal PGD_S. For example, the image signal IMS2 may include not only the image signal IMS1, but also the image signal IMSn which is the result of being sensed using another method. For example, the capacity of the image signal IMS2 stored in the buffer 500 may be greater than the capacity of the image signal IMS1 stored in the buffer 500. However, the embodiment according to the technical ideas of the present invention is not limited thereto.

Figure 19:
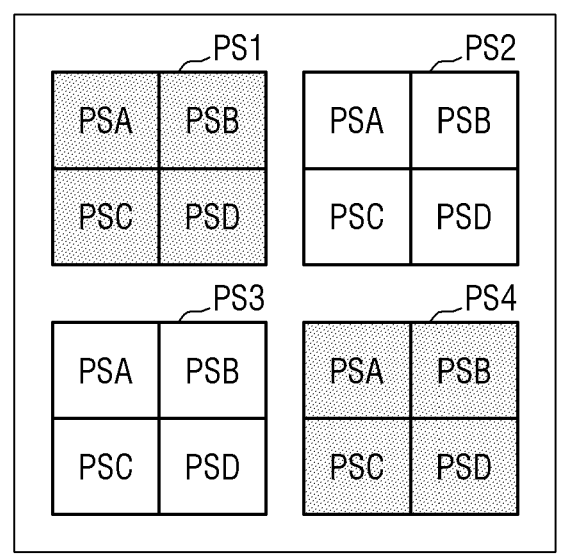

Referring to FIG. 19, the image signal IMS3 may include a partial pixel signal. For example, the image signal IMS3 may include only the first pixel signal PS1 and the fourth pixel signal PS4, but may not include the second pixel signal PS2 and the third pixel signal PS3. Here, the image signal IMS3 may be generated by storing some of the pixel signals PS1, PS2, PS3, and PS4 transferred from the upper chip 200 in the buffer 500. Alternatively, the image signal IMS3 may be an image signal IMS' in which the image signal IMS stored in the buffer 500 is corrected/modified by the image signal processor 600. However, the embodiment according to the technical ideas of the present invention is not limited thereto.

Figure 20:
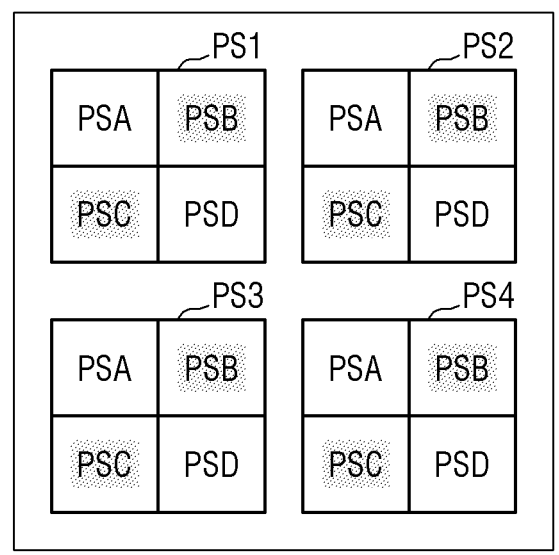

Referring to FIG. 20, the image signal IMS4 may include a partial pixel signal. For example, the image signal IMS4 may include a part of the first pixel signal PS1, a part of the second pixel signal PS2, a part of the third pixel signal PS3, and a part of the fourth pixel signal PS4. For example, the image signal IMS4 stored in the buffer 500 may include the second subpixel signal PSB and the third subpixel signal PSC, but may not include the first subpixel signal PSA and the fourth subpixel signal PSD. For example, the image signal IMS4 may include only the pixel signal transferred from the second tab circuit TB and the third tab circuit TC among the tab circuits TA, TB, TC, and TD.

Also, the image signal IMS4 may be an image signal IMS' corrected/modified by the image signal processor 600. However, the embodiment according to the technical ideas of the present invention is not limited thereto.

The buffer 500 may store various image signals as described above. The buffer 500 may reduce the overload of the image signal processor 600 by storing the image signal and providing it to the image signal processor 600. Also, since the image signal IMS is processed by the image signal processor 600 in the image sensor 100 to generate the image signal IMS', and the image signal IMS' is transferred to the application processor 10, the overload of the application processor 10 may be reduced.

Figure 21:
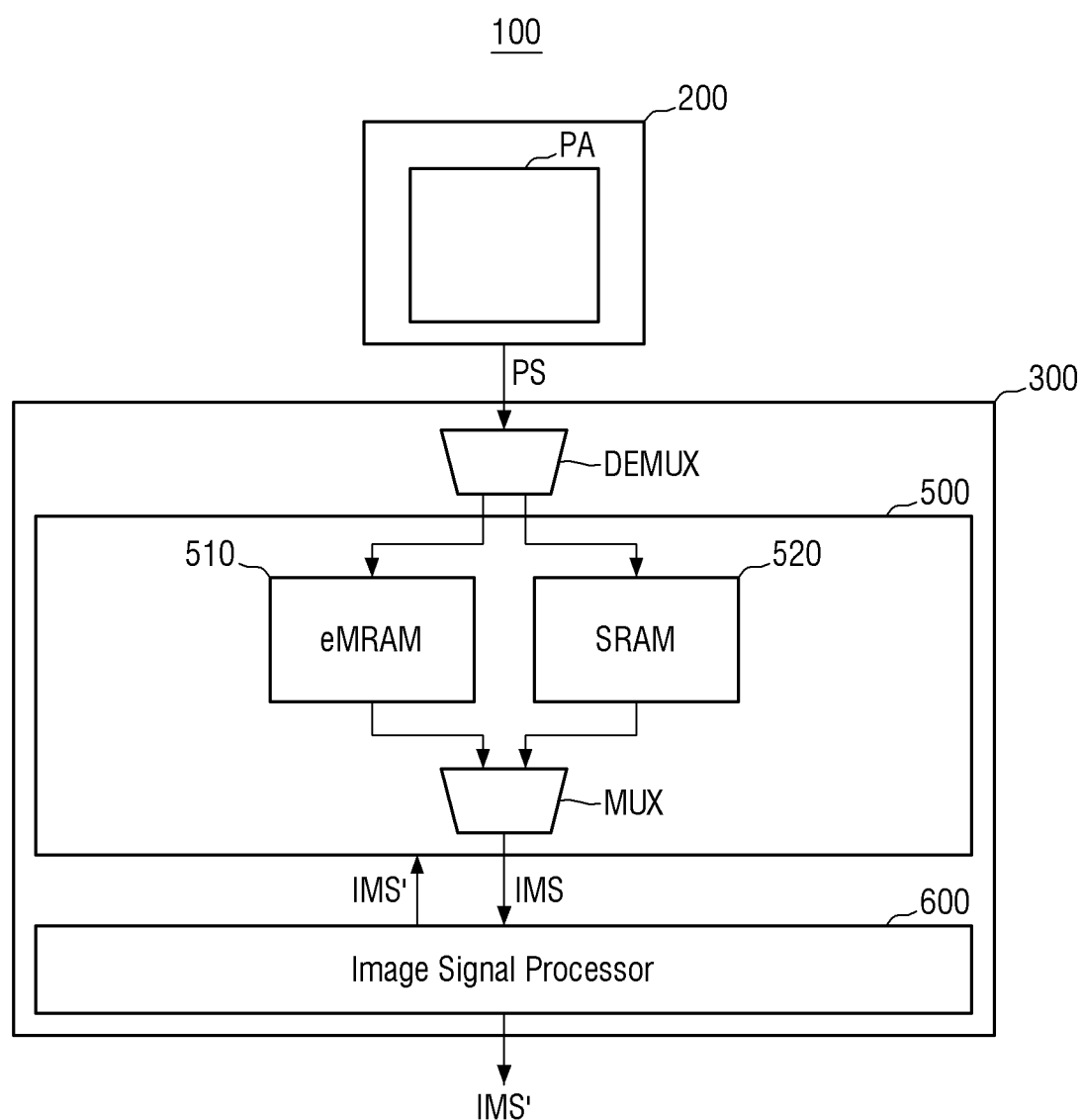
FIG. 21 is a block diagram of an image sensor according to some embodiments.
Figure 22:
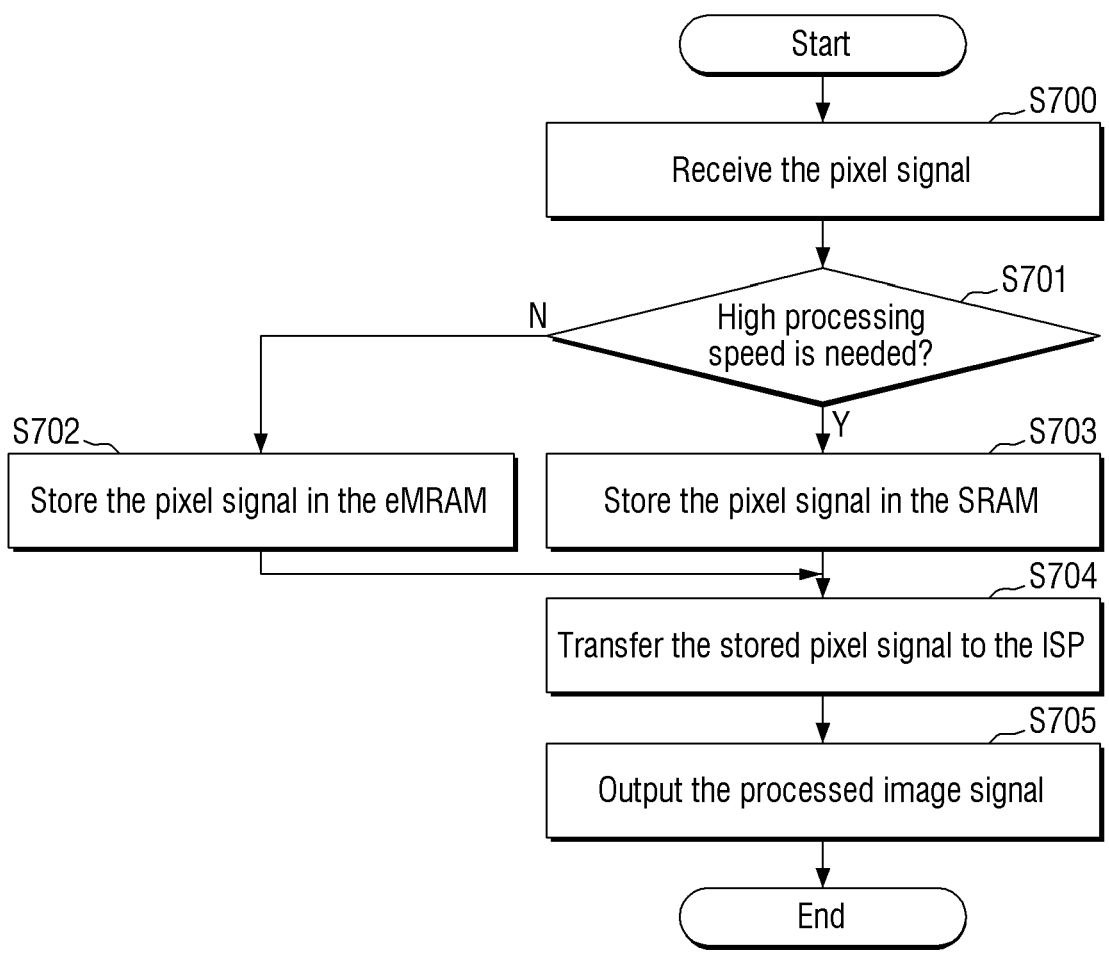
FIG. 22 is a flowchart for explaining an operating method of the image sensor of FIG. 21.

FIG. 21 is a block diagram of an image sensor according to some embodiments. FIG. 22 is a flowchart for explaining an operating method of the image sensor of FIG. 21.

Referring to FIGS. 21 and 22, the lower chip 300 may include a demultiplexer DEMUX, a buffer 500, and an image signal processor 600. Here, the buffer 500 may include a first memory device 510, a second memory device 520, and a multiplexer MUX. Here, the first memory device 510 may include the eMRAM described above, and the second memory device 520 may include a SRAM (static RAM). Both the first memory device 510 and the second memory device 520 may temporarily store the data.

The lower chip 300 may receive the pixel signal PS from the upper chip 200 (S700). For example, the demultiplexer DEMUX may receive the pixel signal PS from the upper chip 200. The demultiplexer DEMUX may determine whether a high processing speed is needed to process the pixel signal PS (S701). For example, when data of the transferred pixel signal PS rapidly increases, the demultiplexer DEMUX may determine whether a high processing speed is needed for the lower chip 300 to process the pixel signal PS.

If a high processing speed is not need to process the pixel signal PS, (S701-N), the image sensor 100 may store the pixel signal PS in the first memory device 510 (S702). When a high processing speed is needed to process the pixel signal PS (S701-Y), the image sensor 100 may store the pixel signal PS in the second memory device 520 (S703). As a result, the buffer 500 stores the pixel signal PS by utilizing a plurality of types of memory devices, and the performance of the buffer 500 and the performance of the image sensor 100 may be further improved.

The multiplexer MUX may receive the pixel signals PS stored in the first memory device 510 and the second memory device 520. The multiplexer MUX may transfer the stored pixel signal PS to the image signal processor 600 (S704). For example, the multiplexer MUX may transfer the image signal IMS to the image signal processor 600.

The image signal processor 600 may perform image processing on the transferred image signal IMS. The image signal processor 600 may output the processed image signal IMS' (S705). Here, the output image signal IMS' may be transferred to the application processor 10 or stored in the buffer 500 again.

Hereinafter, an image sensor 100' according to some other embodiments will be described referring to FIGS. 23 and 24.

Figure 23:
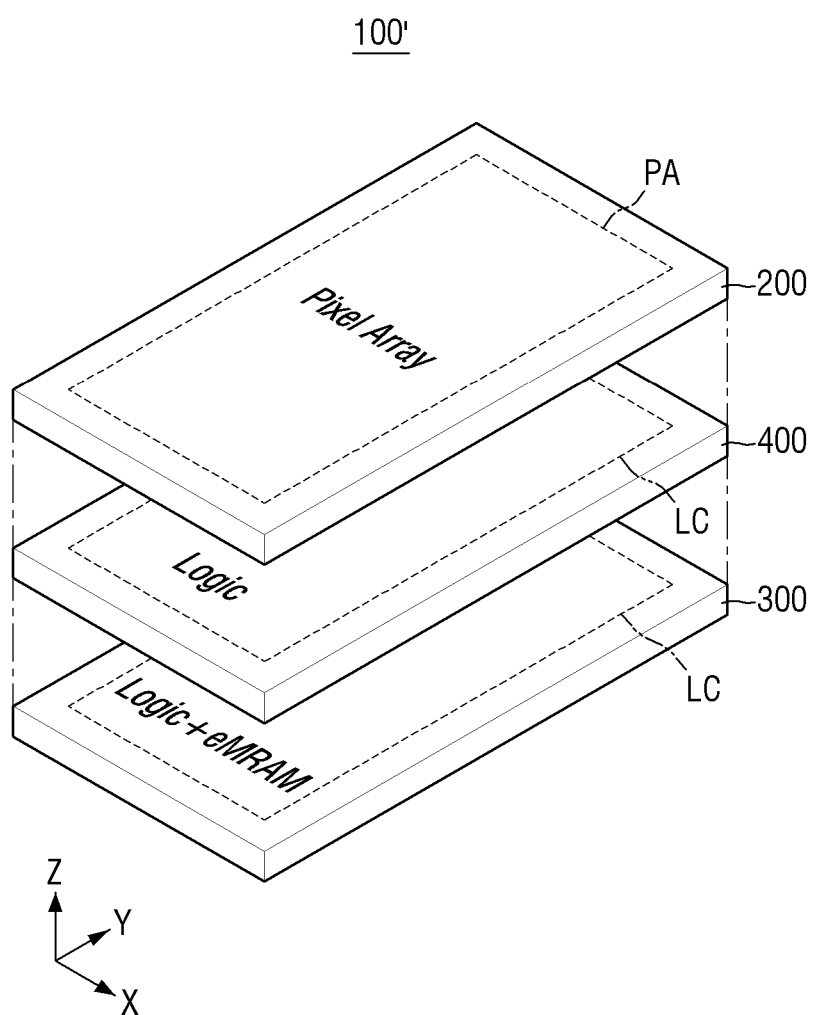
FIG. 23 is a diagram showing a conceptual layout of an image sensor according to some embodiments.

FIG. 23 is a diagram showing a conceptual layout of the image sensor according to some embodiments. FIG. 24 is a block diagram for explaining the image sensor of FIG. 23. For convenience of explanation, repeated parts of contents explained using FIGS. 1 to 22 will be briefly explained or omitted.

Referring to FIG. 23, the image sensor 100' may include an upper chip 200, an intermediate chip 400, and a lower chip 300. The intermediate chip 400 may be stacked on the lower chip 300, and the upper chip 200 may be stacked on the intermediate chip 400. Here, the upper chip 200 and the lower chip 300 may have the same structure as the upper chip 200 and the lower chip 300 explained using FIGS. 1 to 22. For example, the intermediate chip 400 may be placed between the upper chip 200 and the lower chip 300. The intermediate chip 400 may include logic elements of the image sensor 100'.

Figure 24:
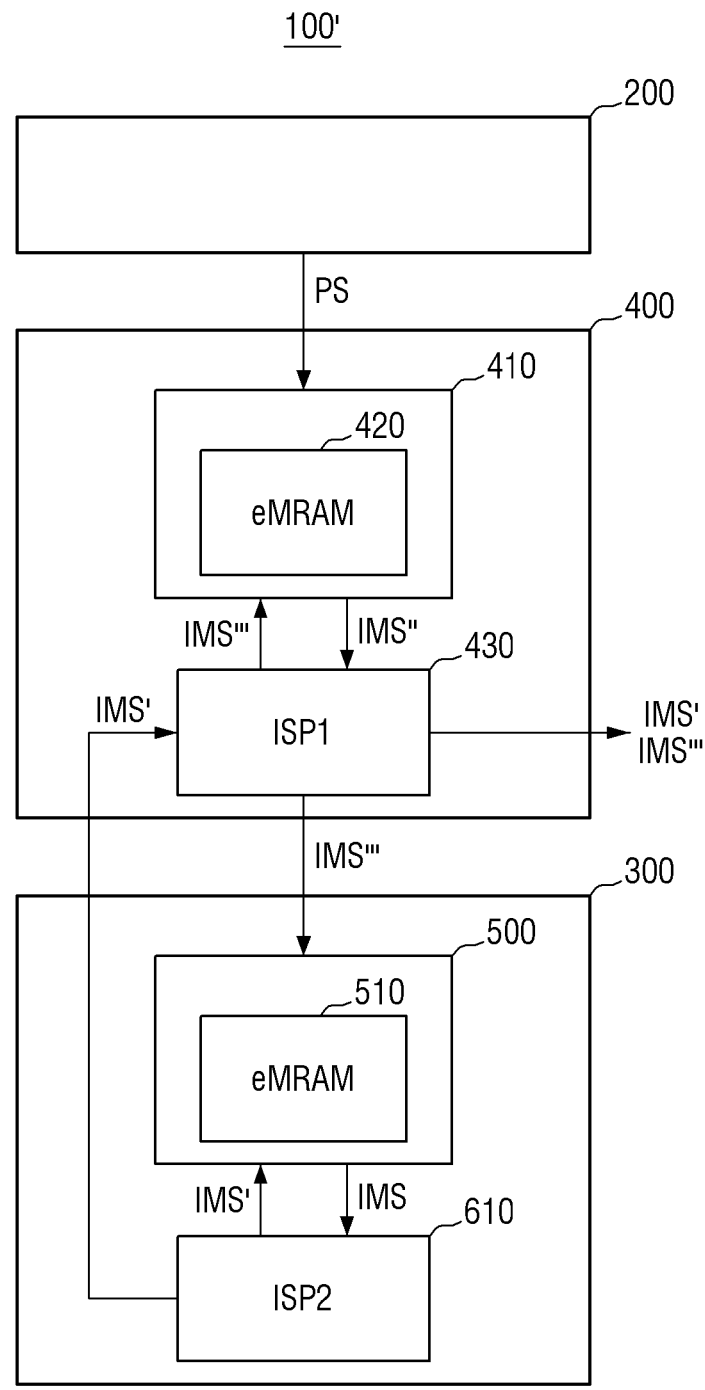
FIG. 24 is a block diagram for explaining the image sensor of FIG. 23.

Referring to FIG. 24, the image sensor 100' may include an upper chip 200, an intermediate chip 400 and a lower chip 300 which are electrically connected to each other. The intermediate chip 400 may include a buffer 410 and a first image signal processor 430. The buffer 410 may include the eMRAM 420 described above. The buffer 410 may receive the pixel signal PS from the upper chip 200 and store the pixel signal PS in the eMRAM 420.

The pixel signal PS stored in the eMRAM 420 may be output as an image signal IMS". The image signal IS" may be transferred to the first image signal processor 430. The first image signal processor 430 may perform image processing on the image signal IMS". For example, the first image signal processor 430 may output a corrected/modified image signal IS'". The image signal IMS'" may be transferred to the application processor 10 or may be transmitted to the buffer 410 again. Also, the image signal IMS'" may be transferred to the lower chip 300.

The lower chip 300 may include a buffer 500 and a second image signal processor 610. The buffer 500 may include the first memory device 510 described above. The first memory device 510 may be an eMRAM. The buffer 500 may store the transferred image signal IMS'" in the first memory device 510.

The image signal IMS'" stored in the first memory device 510 may be output as the image signal IMS. The image signal IMS may be transferred to a second image signal processor 610. The second image signal processor 610 may perform image processing on the image signal IMS. For example, the second image signal processor 610 may output the corrected/modified image signal IMS'. Here, the image signal IMS' may include depth information of the pixel signal PS and the image signal IMS'".

The corrected/modified image signal IMS' may be transferred to the buffer 500 again or may be transferred to the intermediate chip 400. The image signal IMS' transferred to the intermediate chip 400 may be transferred to the first image signal processor 430. The first image signal processor 430 may perform image processing on the image signal IMS' and transfer the corrected/modified image signal IMS' to the application processor 10. Alternatively, the first image signal processor 430 may transfer the received image signal directly to the application processor 10.

Hereinafter, an electronic device 2000 according to some other embodiments will be described referring to FIGS. 25 and 26.

Figure 25:
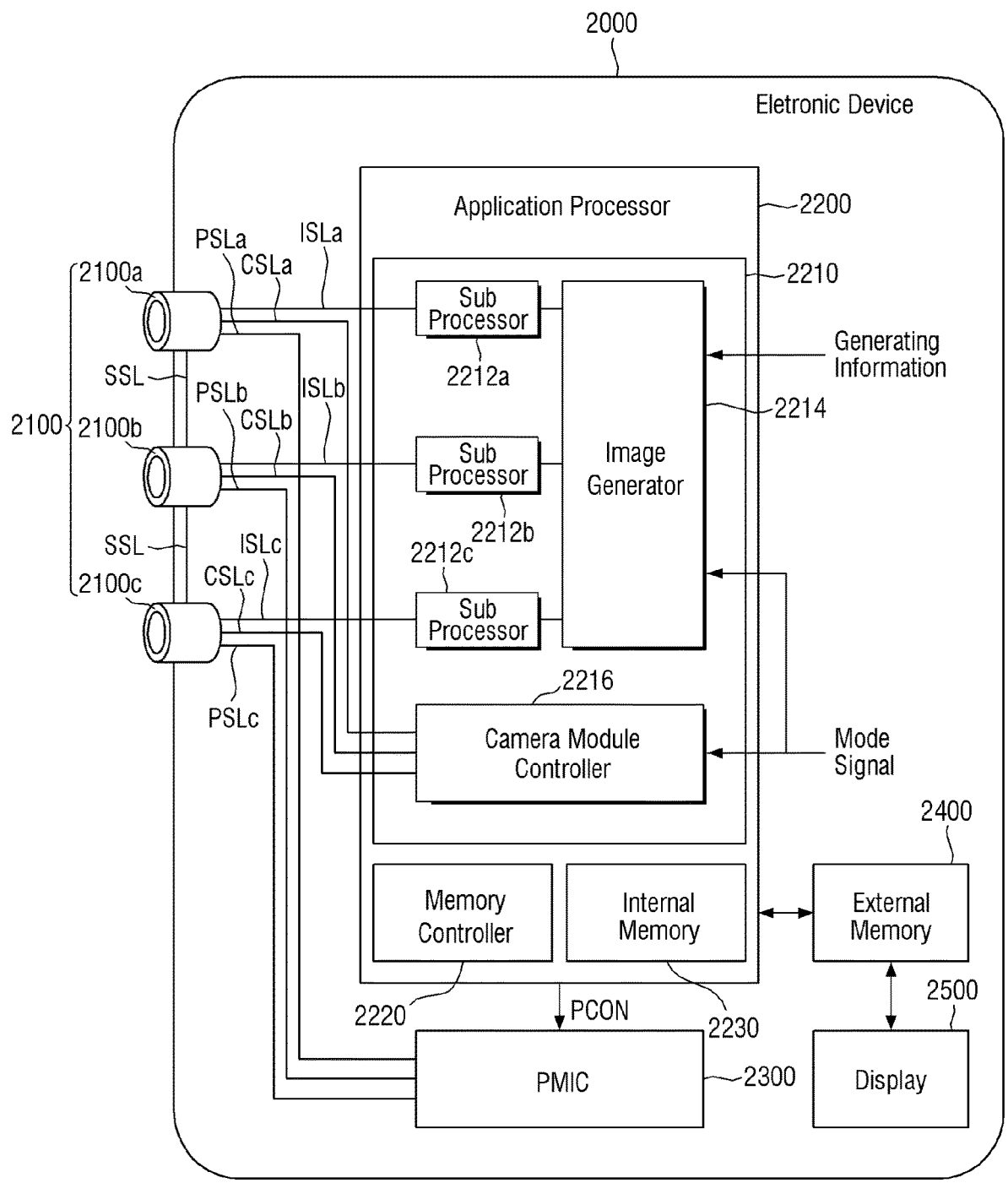
FIG. 25 is a block diagram for explaining an electronic device including a multi-camera module according to some embodiments.

FIG. 25 is a block diagram for explaining an electronic device including a multi-camera module according to some embodiments. FIG. 26 is a detailed block diagram of the camera module of FIG. 25. For convenience of explanation, repeated parts of contents explained using FIGS. 1 to 24 will be briefly described or omitted.

Referring to FIG. 25, the electronic device 2000 may include a camera module group 2100, an application processor 2200, a PMIC 2300, an external memory 2400, and a display 2500.

The camera module group 2100 may include a plurality of camera modules 2100a, 2100b, and 2100c. Even though the drawings show an embodiment in which three camera modules 2100a, 2100b, and 2100c are placed, the embodiments are not limited thereto. In some embodiments, the camera module group 2100 may include only two camera modules. Also, in some embodiments, the camera module group 2100 may include n camera modules (n is a natural number of 4 or more).

Here, one of the three camera modules 2100a, 2100b, and 2100c may be a camera module including an image sensors 100 and 100' explained using FIGS. 1 to 24.

Hereinafter, although the detailed configuration of the camera module 2100b will be described more specifically referring to FIG. 26, the following description may also be applied in the same way to other camera modules 2100a and 2100c according to the embodiment.

Figure 26:
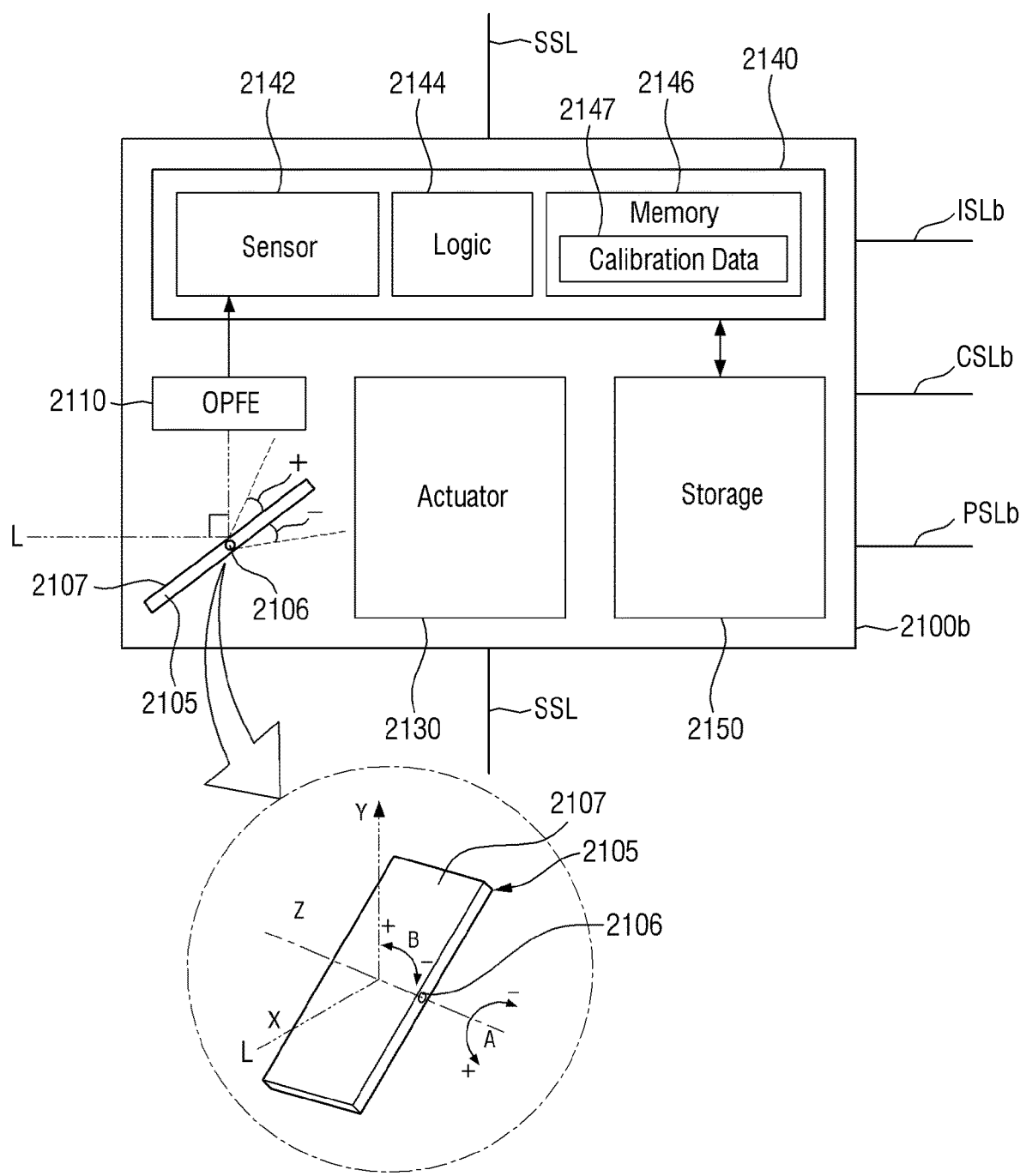
FIG. 26 is a detailed block diagram of a camera module of FIG. 25.

Referring to FIG. 26, the camera module 2100b may include a prism 2105, an optical path folding element (hereinafter, "OPFE") 2110, an actuator 2130, an image sensing device 2140, and a storage 2150.

The prism 2105 may include a reflecting face 2107 including a light reflecting material to deform/change the path of light L incident from the outside.

In some embodiments, the prism 2105 may change the path of light L incident in the first direction X to a second direction Y perpendicular to the first direction X. Further, the prism 2105 may rotate the reflecting face 2107 including the light reflecting material in a direction A around a central axis 2106, or may rotate the reflecting face 2107 around the central axis 2106 in a direction B to change the path of the light L incident in the first direction X to the vertical second direction Y. At this time, an OPFE 2110 may also move in a third direction Z perpendicular to the first direction X and the second direction Y.

In some embodiments, regarding rotation directions of angles shown in FIG. 26, a maximum rotation angle of the prism 2105 in the direction A may be equal to or less than 15 degrees in a positive (+) direction A and greater than 15 degrees in a negative (−) direction A, but the embodiments are not limited thereto.

In some embodiments, the prism 2105 may move at about 20 degrees, or between 10 and 20 degrees, or between 15 and 20 degrees in the positive (+) and/or negative (−) direction B, e.g., with respect to a reference position. Here, the moving angle may move at the same angle in the positive (+) or negative (−) direction B, or may move almost at the same angle within the range of about 1 degree.

In some embodiments, the prism 2105 may move the reflecting face 2106 including the light reflecting material in a third direction (e.g., the direction Z) parallel to an extension direction of the central axis 2106.

The OPFE 2110 may include, for example, an optical lens including m (here, m is a natural number) lenses. The m lenses may move in the second direction Y to change an optical zoom ratio of the camera module 2100b. For example, when a basic optical zoom ratio of the camera module 2100b is defined as Z, in a case of moving the m optical lenses included in the OPFE 2110, the optical zoom ratio of the camera module 2100b may be changed to an optical zoom ratio of 3Z or 5Z or higher.

The actuator 2130 may move the OPFE 2110 or an optical lens (hereinafter referred to as an optical lens) to a specific position. For example, the actuator 2130 may adjust the position of the optical lens so that the image sensor 2142 is located at the focal length of the optical lens for accurate sensing.

The image sensing device 2140 may include an image sensor 2142, a control logic 2144, and a memory 2146. The image sensor 2142 may sense the image to be sensed, using the light L provided through the optical lens. In some embodiments, the image sensor 2142 may include the image sensors 100 and 100' described above.

The control logic 2144 may control the overall operation of the camera module 2100b. For example, the control logic 2144 may control the operation of the camera module 2100b according to the control signal provided through the control signal line CSLb.

The memory 2146 may store information necessary for the operation of the camera module 2100b, such as a calibration data 2147. The calibration data 2147 may include information necessary for the camera module 2100b to generate image data, using light L provided from the outside. The calibration data 2147 may include, for example, aforementioned information on the degree of rotation, information on the focal length, information on the optical axis, and the like. If the camera module 2100b is implemented in the form of a multi-state camera whose focal length changes depending on the position of the optical lens, the calibration data 2147 may include focal length values for each position (or for each state) of the optical lens 2147, and information about the auto-focusing.

The storage 2150 may store the sensed image data through the image sensor 2142. The storage 2150 may be placed outside the image sensing device 2140, and may be implemented in the form of being stacked with the sensor chips constituting the image sensing device 2140. In some embodiments, although the storage 2150 may be implemented as an EEPROM (Electrically Erasable Programmable Read-Only Memory), the embodiments are not limited thereto. The storage 2150 may be implemented by the lower chip 300. The storage 2150 may include the aforementioned buffer 500.

Referring to FIGS. 25 and 26 together, in some embodiments, each of the plurality of camera modules 2100a, 2100b, and 2100c may include an actuator 2130. Accordingly, each of the plurality of camera modules 2100a, 2100b, and 2100c may include calibration data 2147 that are the same as or different from each other, depending on the operation/function of the actuator 2130 included therein.

In some embodiments, one camera module (e.g., 2100b) among the plurality of camera modules 2100a, 2100b, and 2100c may be a folded lens type camera module including the prism 2105 and the OPFE 2110 described above, and the remaining camera modules (e.g., 2100a and 2100c) may be vertical type camera modules which do not include the prism 2105 and the OPFE 2110. However, the embodiments are not limited thereto.

In some embodiments, one camera module (e.g., 2100c) among the plurality of camera modules 2100a, 2100b, and 2100c may be a vertical type depth camera which extracts depth information, for example, using an IR (Infrared Ray). In this case, the application processor 2200 may merge the image data provided from such a depth camera with the image data provided from other camera modules (e.g., 2100a or 2100b) to generate a 3D depth image. Further, an image signal processor 600 according to the embodiment of the present invention may merge the image signal IMS to generate a 3D depth image. For example, before being processed by the application processor 2200, the image signal processor 600 in the image sensor 100 may generate a 3D depth image.

In some embodiments, at least two camera modules (e.g., 2100a, 2100c) among the plurality of camera modules 2100a, 2100b, and 2100c may have field of views (viewing angles) different from each other. In this case, for example, the optical lenses of at least two camera modules (e.g., 2100a and 2100c) among the plurality of camera modules 2100a, 2100b, and 2100c may be different from each other, but the embodiment is not limited thereto.

Also, in some embodiments, the viewing angles of each of the plurality of camera modules 2100a, 2100b, and 2100c may be different from each other. In this case, the optical lenses included in each of the plurality of camera modules 2100a, 2100b, and 2100c may also be different, but the embodiment is not limited thereto.

In some embodiments, each of the plurality of camera modules 2100a, 2100b, and 2100c may be placed to be physically separated from each other. For example, in the previous embodiments, the plurality of camera modules 2100a, 2100b, and 2100c may separately uses respective sensing regions of one image sensor 2142. However, in some embodiments, an independent image sensor 2142 may be placed inside each of the plurality of camera modules 2100a, 2100b, and 2100c.

Referring to FIG. 25 again, the application processor 2200 may include an image processing device 2210, a memory controller 2220, and an internal memory 2230. The application processor 2200 may be implemented separately from the plurality of camera modules 2100a, 2100b, and 2100c. For example, the application processor 2200 and the plurality of camera modules 2100a, 2100b, and 2100c may be implemented in respective semiconductor chips.

The image processing device 2210 may include a plurality of sub-image processors 2212a, 2212b, and 2212c, an image generator 2214, and a camera module controller 2216.

The image processing device 2210 may include a plurality of sub-image processors 2212a, 2212b, and 2212c corresponding to the number of the plurality of camera modules 2100a, 2100b, and 2100c.

The image data generated from each of the camera modules 2100a, 2100b, and 2100c may be provided to the corresponding sub-image processors 2212a, 2212b, and 2212c through the image signal lines ISLa, ISLb, and ISLc separated from each other. For example, the image data generated from the camera module 2100a may be provided to the sub-image processor 2212a through the image signal line ISLa, the image data generated from the camera module 2100b may be provided to the sub-image processor 2212b through the image signal line ISLb, and the image data generated from the camera module 2100c may be provided to the sub-image processor 2212c through the image signal line ISLc. Transmission of the image data may be performed using, for example, a camera serial interface (CSI) based on MIPI (Mobile Industry Processor Interface), but the embodiments are not limited thereto.

On the other hand, in some embodiments, one sub-image processor may be placed to correspond to the plurality of camera modules. For example, one image processor may receive image data generated from multiple camera modules, e.g., 2100a, 2100b and/or 2100c. In certain embodiments, one image processor may receive image data from all camera modules included in an electronic device 2000. For example, the sub-image processor 2212a and the sub-image processor 2212c are not implemented separately from each other as shown in FIG. 25, but may be implemented by being integrated into a single sub-image processor, and the image data provided from the camera module 2100a and the camera module 2100c may be selected through a selection element (e.g., a multiplexer) or the like and then provided to the integrated sub-image processor.

The image data provided to the respective sub-image processors 2212a, 2212b, and 2212c may be provided to the image generator 2214. The image generator 2214 may generate an output image, using the image data provided from the respective sub-image processors 2212a, 2212b, and 2212c according to the image generating information or the mode signal.

For example, the image generator 2214 may merge at least some of the image data generated from the camera modules 2100a, 2100b, and 2100c having different viewing angles according to the image generating information and the mode signals to generate the output image. Also, the image generator 2214 may select any one of the image data generated from the camera modules 2100a, 2100b, and 2100c having different viewing angles according to the image generating information and the mode signal to generate the output image.

In some embodiments, the image generating information may include a zoom signal (or zoom factor). In some embodiments, the mode signal may be, for example, a signal based on the mode selected from a user.

If the image generating information is a zoom signal (zoom factor) and each of the camera modules 2100a, 2100b, and 2100c has different field of views (viewing angles), the image generator 2214 may perform different operations, depending on the type of zoom signal. For example, when the zoom signal is a first signal, after the image data output from the camera module 2100a and the image data output from the camera module 2100c are merged, an output image may be generated, using the merged image signal, and the image data output from the camera module 2100b which is not used for merging. If the zoom signal is a second signal different from the first signal, the image generator 2214 may not merge the image data, and may select any one of image data output from each of the camera modules 2100a, 2100b, and 2100c and generate the output image. However, the embodiments are not limited thereto, and the method of processing the image data may be modified as much as necessary.

In some embodiments, the image generator 2214 may receive a plurality of image data with different exposure times from at least one of the plurality of sub-image processors 2212a, 2212b, and 2212c, and perform a HDR (high dynamic range) process on the plurality of image data, thereby generating merged image data with an increased dynamic range.

The camera module controller 2216 may provide the control signal to each of the camera modules 2100a, 2100b, and 2100c. The control signal generated from the camera module controller 2216 may be provided to the corresponding camera modules 2100a, 2100b, and 2100c through control signal lines CSLa, CSLb and CSLc separated from each other.

Any one of the plurality of camera modules 2100a, 2100b, and 2100c is specified as a master camera (e.g., 2100a) according to the image generating information including the zoom signal, or the mode signal, and each of the remaining camera modules (e.g., 2100b and 2100c) may be specified as a slave camera. Such information is included in the control signal, and may be provided to the corresponding camera modules 2100a, 2100b, and 2100c through the control signal lines CSLa, CSLb and CSLc separated from each other.

The camera modules that operate as master and slave may be modified, depending on the zoom factor or the operation mode signal. For example, when the viewing angle of the camera module 2100a is wider than the viewing angle of the camera module 2100c and the zoom factor shows a low zoom ratio, the camera module 2100c may operate as the master, and the camera module 2100a may operate as a slave. In contrast, when the zoom factor shows a high zoom ratio, the camera module 2100a may operate as a master, and the camera module 2100c may operate as a slave.

In some embodiments, the control signal provided from the camera module controller 2216 to the respective camera module 2100a, 2100b, and 2100c may include a sync enable signal. For example, when the camera module 2100b is the master camera and the camera modules 2100a and 2100c are slave cameras, the camera module controller 2216 may transmit the sync enable signal to the camera module 2100b. The camera module 2100b provided with the sync enable signal generates the sync signal on the basis of the provided sync enable signal, and may provide the generated sync signal to the camera modules 2100a and 2100c through the sync signal line SSL. The camera module 2100b and the camera modules 2100a and 2100c may transmit the image data to the application processor 2200 in synchronization with such sync signal.

In some embodiments, the control signal provided from the camera module controller 2216 to the plurality of camera modules 2100a, 2100b, and 2100c may include mode information according to the mode signal. The plurality of camera modules 2100a, 2100b, and 2100c may operate in a first operation mode and a second operation mode in relation to the sensing speed, on the basis of mode information.

The plurality of camera modules 2100a, 2100b, and 2100c may generate an image signal at a first speed (for example, generates an image signal of a first frame rate) in a first operation mode, encode the image signal at a second speed higher than the first speed (for example, encodes an image signal of a second frame rate higher than the first frame rate), and transmit the encoded image signal to the application processor 2200. At this time, the second speed may be equal to or less than 30 times the first speed.

The application processor 2200 may store the received image signal, e.g., the encoded image signal, in the internal memory 2230 or the external storage 2400 of the application processor 2200, thereafter, read and decode the encoded image signal from the memory 2230 or the storage 2400, and display the image data generated on the basis of the decoded image signal. For example, the corresponding sub-processors 2212a, 2212b, and 2212c of the plurality of sub-processors 2212a, 2212b, and 2212c of the image processing device 2210 may perform decoding, and may also perform image processing on the decoded image signal. For example, the image data generated on the basis of the decoded image signal may be displayed on the display 2500.

The plurality of camera modules 2100a, 2100b, and 2100c may generate image signals at a third speed lower than the first speed (e.g., generate an image signal of a third frame rate lower than the first frame rate) in the second operation mode, and transmit the image signal to the application processor 2200. The image signal provided to the application processor 2200 may be a non-encoded signal. The application processor 2200 may perform image processing on the received image signal or store the image signal in the memory 2230 or the storage 2400.

The PMIC 2300 may supply power, for example, a power supply voltage, to each of a plurality of camera modules 2100a, 2100b, and 2100c. For example, the PMIC 2300 may supply a first power to the camera module 2100a through a first power signal line PSLa, supply a second power to the camera module 2100b through a second power signal line PSLb, and supply a third power to the camera module 2100c through a third power signal line PSLc, under the control of the application processor 2200.

The PMIC 2300 may respond to a power control signal PCON from the application processor 2200, generate power corresponding to each of the plurality of camera modules 2100a, 2100b, and 2100c, and adjust the level of the power. The power control signal PCON may include power adjustment signals for each operation mode of the plurality of camera modules 2100a, 2100b, and 2100c. For example, the operation mode may include a low power mode, and at this time, the power control signal PCON may include information about the camera module operating in the low power mode and the set power level. The levels of powers provided to each of the plurality of camera modules 2100a, 2100b, and 2100c may be identical to or different from each other. Also, the levels of powers may be changed dynamically.

Although the embodiments of the present invention have been described above referring to the attached drawings, the present invention is not limited to the embodiments and may be produced in various different forms. Those skilled in the art will appreciate that the invention may be implemented in other specific forms without changing the technical ideas and essential features of the present invention. Therefore, the disclosed preferred embodiments of the invention are used in a generic and descriptive sense only and not for purposes of limitation.

What is claimed is:

1. An image sensor comprising:
an upper chip including pixels; and
a lower chip placed below the upper chip,
wherein a pixel of the pixels includes an optical conversion element configured that light is incident on the optical conversion element, a first storage gate or a first storage node which is electrically connected to the optical conversion element and configured to store electric charge transferred from the optical conversion element during a first time interval, and a second storage gate or a second storage node which is electrically connected to the optical conversion element and configured to store the electric charge transferred from the optical conversion element during a second time interval different from the first time interval,
wherein the pixel is configured to generate a first pixel signal on the basis of the electric charge stored in the first storage gate or the first storage node, and configured to generate a second pixel signal on the basis of the electric charge stored in the second storage gate or the second storage node,
wherein the lower chip includes
a frame buffer configured to store the generated first and second pixel signals; and
an image signal processor configured to receive the stored first and second pixel signals from the frame buffer and perform image processing on the first and second pixel signals,
wherein the frame buffer includes an MRAM,
wherein the lower chip includes a first metal layer, and a second metal layer placed on the first metal layer,
wherein the frame buffer includes an MTJ element and a transistor,
wherein the MTJ element is placed between the first metal layer and the second metal layer, and is electrically connected to the transistor through the first metal layer, and
wherein a thickness of the second metal layer is greater than a thickness of the first metal layer.

2. The image sensor of claim 1, wherein the pixel includes a third storage gate which is electrically connected to the optical conversion element and configured to store a signal transferred from the optical conversion element during a third time interval different from the first and second time intervals, and a fourth storage gate which is electrically connected to the optical conversion element and configured to store a signal transferred from the optical conversion element during a fourth time interval different from the first to third time intervals.

3. The image sensor of claim 2, wherein the pixel is configured to generate a third pixel signal on the basis of the electric charge stored in the third storage gate, and configured to generate a fourth pixel signal on the basis of the electric charge stored in the fourth storage gate, and
the frame buffer is configured to store the generated third and fourth pixel signals.

4. The image sensor of claim 1, wherein the pixels include a global shutter pixel.

5. The image sensor of claim 1, wherein the pixel includes a first photogate which electrically connects the first storage gate and the optical conversion element, and a second photogate which electrically connects the second storage gate and the optical conversion element, and
the image sensor is so configured that a first gate signal is applied to the first photogate, and a second gate signal is applied to the second photogate.

6. The image sensor of claim 5, wherein a difference between a phase of the first gate signal and a phase of the second gate signal is 180 degrees.

7. The image sensor of claim 1, wherein the first storage gate is configured to store the electric charge transferred from the optical conversion element during a third time interval different from the first and second time intervals,
the second storage gate is configured to store the electric charge transferred from the optical conversion element during a fourth time interval different from the first to third time intervals, and
the pixel is configured to generate a third pixel signal on the basis of the electric charge stored in the first storage gate during the third time interval, and configured to generate a fourth pixel signal on the basis of the electric charge stored in the second storage gate during the fourth time interval.

8. The image sensor of claim 7, wherein the frame buffer is configured to store the generated third and fourth pixel signals, and
the image signal processor is configured to receive the third and fourth pixel signals from the frame buffer, and configured to perform image processing on the first to fourth pixel signals to output an image signal.

9. The image sensor of claim 1, wherein the image signal processor is configured to perform image processing on the first and second pixel signals to output a first image signal, and
the frame buffer is configured to store the first image signal.

10. An image sensor comprising:
an upper chip including pixels; and
a lower chip placed below the upper chip,
wherein a pixel of the pixels includes an optical conversion element configured that light is incident on the optical conversion element, a first storage gate or a first storage node which is electrically connected to the optical conversion element and configured to store electric charge transferred from the optical conversion element during a first time interval, and a second storage gate or a second storage node which is electrically connected to the optical conversion element and configured to store electric charge transferred from the optical conversion element during a second time interval different from the first time interval,
wherein the pixel is configured to generate a first pixel signal on the basis of the electric charge stored in the first storage gate or the first storage node, and configured to generate a second pixel signal on the basis of the electric charge stored in the second storage gate or the second storage node,
wherein the lower chip includes
a frame buffer configured to store the generated first and second pixel signals; and
an image signal processor configured to receive the stored first and second pixel signals from the frame buffer and perform image processing on the first and second pixel signals,
wherein the frame buffer includes an MRAM,
wherein the frame buffer includes an SRAM different from the MRAM, and
the image sensor is so configured that the SRAM stores the generated first and second pixel signals.

11. The image sensor of claim 10, wherein the image sensor is so configured that the MRAM does not operate while the SRAM is operating.

12. An image sensor comprising:
an upper chip including pixels;
an intermediate chip located below the upper chip; and
a lower chip placed below the intermediate chip,
wherein a pixel of the pixels includes an optical conversion element configured that light is incident on the optical conversion element, a first storage gate or a first storage node which is electrically connected to the optical conversion element and configured to store electric charge transferred from the optical conversion element during a first time interval, and a second storage gate or a second storage node which is electrically connected to the optical conversion element and configured to store the electric charge transferred from the optical conversion element during a second time interval different from the first time interval,
the pixel is configured to generate a first pixel signal on the basis of the electric charge stored in the first storage gate, and to generate a second pixel signal on the basis of the electric charge stored in the second storage gate,
the intermediate chip includes a first image signal processor which is configure to receive the first and second pixel signals from the pixel, and to perform image processing on the first and second pixel signals to generate a first image signal,
the lower chip includes a first frame buffer configured to receive and store the first image signal from the first image signal processor, and a second image signal processor configured to receive the stored first image signal from the first frame buffer and to perform image processing on the first image signal to generate a second image signal, and
the first frame buffer includes an MRAM.

13. The image sensor of claim 12, wherein the intermediate chip includes a second frame buffer configured to receive and store the first and second pixel signals from the pixel,
the second frame buffer is configured to provide the stored first and second pixel signals to the first image signal processor, and
the second frame buffer includes an MRAM.

14. The image sensor of claim 12, wherein the second image signal processor is configured to transfer the generated second image signal to the first image signal processor, and
the first image signal processor is configured to perform image processing on the second image signal to generate a third image signal.

15. The image sensor of claim 12, wherein the first frame buffer is configured to store the generated second image signal, and to provide the stored second image signal to the second image signal processor.

* * * * *